United States Patent
Rhoads et al.

(10) Patent No.: US 9,330,563 B2
(45) Date of Patent: May 3, 2016

(54) SYNCHRONIZED METROLOGY IN POWER GENERATION AND DISTRIBUTION NETWORKS

(71) Applicant: Digimarc Corporation, Beaverton, OR (US)

(72) Inventors: Geoffrey B. Rhoads, West Linn, OR (US); Conrad Eustis, Portland, OR (US)

(73) Assignee: Digimarc Corporation, Beaverton, OR (US)

(*) Notice: Subject to any disclaimer, the term of this patent is extended or adjusted under 35 U.S.C. 154(b) by 68 days.

(21) Appl. No.: 14/220,838

(22) Filed: Mar. 20, 2014

(65) Prior Publication Data

US 2014/0340236 A1  Nov. 20, 2014

Related U.S. Application Data

(63) Continuation-in-part of application No. 13/765,404, filed on Feb. 12, 2013.

(60) Provisional application No. 61/803,540, filed on Mar. 20, 2013.

(51) Int. Cl.
*H04Q 9/00* (2006.01)
*G08C 19/12* (2006.01)
(Continued)

(52) U.S. Cl.
CPC .............. *G08C 19/12* (2013.01); *G01D 4/002* (2013.01); *G01R 19/2513* (2013.01);
(Continued)

(58) Field of Classification Search
CPC .......... G01D 4/002; H04Q 9/00; H04Q 9/04; Y02B 90/241; Y02B 90/246; Y02S 20/32; Y02S 20/42; Y04S 20/32; Y04S 20/42
See application file for complete search history.

(56) References Cited

U.S. PATENT DOCUMENTS

| 5,617,329 A | 4/1997 | Allison et al. |
| 2003/0169029 A1 | 9/2003 | Piesinger |

(Continued)

FOREIGN PATENT DOCUMENTS

| DE | 102008044915 | 3/2010 |
| WO | WO2013025836 | 2/2013 |

OTHER PUBLICATIONS

PCT International Preliminary Report on Patentability, PCT/US2012/050994 (published as WO2013025836), Feb. 18, 2014.
(Continued)

*Primary Examiner* — Andrew Bee
(74) *Attorney, Agent, or Firm* — Digimarc Corporation

(57) ABSTRACT

Phasor Measurement Units (PMUs) tend to be specialized and expensive—relegated to only key points in power distribution networks, and are generally reliant on GPS technology. The present disclosure details how any smart meter—using wireless communication—can perform sub-microsecond-grade synchrophasor measurements. Other aspects concern smart meter-based determination of A, B or C phase of the tri-phase power network. This can involve count-stamp enabling message packets sent to and/or from a smart meter, and then associating such count-stamps to local measurements of power phase by a metrology unit. Once a network of such enabled smart meters and other devices is formed, sub-microsecond metropolitan-wide and entire region-wide synchronizing time standard can calibrate local measurements of power phase, where simple A, B and C phase determination is one low hanging fruit application of such. Low cost aggregate monitoring of metropolitan-wide synchrophasors promises a next chapter of importance for that relatively recent art.

18 Claims, 9 Drawing Sheets

(51) Int. Cl.
  *G06Q 50/06* (2012.01)
  *G01D 4/00* (2006.01)
  *H04Q 9/04* (2006.01)
  *G01R 19/25* (2006.01)
  *G01R 29/18* (2006.01)
  *G01R 22/10* (2006.01)

(52) U.S. Cl.
  CPC ............... *G01R 29/18* (2013.01); *G06Q 50/06* (2013.01); *H04Q 9/00* (2013.01); *H04Q 9/04* (2013.01); *G01R 22/10* (2013.01); *Y02B 90/241* (2013.01); *Y02B 90/246* (2013.01); *Y02B 90/248* (2013.01); *Y02E 60/728* (2013.01); *Y04S 10/265* (2013.01); *Y04S 20/32* (2013.01); *Y04S 20/42* (2013.01); *Y04S 20/48* (2013.01); *Y04S 20/52* (2013.01)

(56) References Cited

U.S. PATENT DOCUMENTS

| | | |
|---|---|---|
| 2005/0273320 A1 | 12/2005 | Yamaguchi et al. |
| 2007/0100570 A1 | 5/2007 | Xu |
| 2008/0049880 A1 | 2/2008 | Zweigle et al. |
| 2008/0116877 A1 | 5/2008 | Giubbini et al. |
| 2009/0088989 A1 | 4/2009 | Guzman-Casillas |
| 2010/0060259 A1 | 3/2010 | Vaswani et al. |
| 2010/0134089 A1 | 6/2010 | Uram et al. |
| 2010/0262395 A1 | 10/2010 | Sharma et al. |
| 2011/0161022 A1 | 6/2011 | Caird |
| 2011/0208364 A1* | 8/2011 | DeLoach, Jr. ............ H04Q 9/04 700/286 |
| 2012/0179404 A1 | 7/2012 | Lee et al. |
| 2013/0024149 A1 | 1/2013 | Nayar et al. |
| 2013/0124758 A1* | 5/2013 | Ree ........................ G01D 4/002 709/248 |
| 2013/0241746 A1* | 9/2013 | McKinley .............. G01D 4/002 340/870.02 |
| 2013/0293390 A1* | 11/2013 | Le Buhan .............. G01D 4/004 340/870.02 |

OTHER PUBLICATIONS

PCT International Search Report, PCT/US2012/050994 (published as WO2013025836), Nov. 16, 2012.

PCT Written Opinion of the international Searching Authority, PCT/US2012/050994 (published as WO2013025836), Nov. 16, 2012.

Amelot et al, An IEEE 1588 Time Synchronization Testbed for Assessing Power Distribution Requirements, IEEE Symp on Precision Clock Synchronization for Measurement Control and Communication (ISPCS), 2010.

Fletcher, et al, Smart Clocks Have a Hand in the Smart Grid, IEEE Power and Energy Society General Meeting, Jul. 24, 2011.

Kasztenny, et al, Communications and Data Synchronization for Line Current Differential Schemes, Proc. 38th Annual Western Protective Relay Conference, 2011.

Kasztenny, et al, Implementation and Performance of Synchrophasor Function within Microprocessor Based Relays, 61st Annual Georgia Tech Protective Relaying Conference, 2007.

Sykes, et al, Synchrophasors—A Primer and Practical Applications, Power Systems Conference—Advanced Metering, Protection, Control, Communication, and Distributed Resources, IEEE, 2007.

Villamagna, A Symmetrical Component-Based GPS Signal Failure Detection Algorithm for use in Feeder Current Differential Protection, IEEE Trans. on Power Delivery, vol. 23, No. 4, 2008.

* cited by examiner

| WHO AM I | WHERE AM I | COUNT-STAMP INFO | PERMISSIONS/ SECURITY | ADMIN |

SYNCHRONIZED METROLOGY IN POWER GENERATION AND DISTRIBUTION NETWORKS

RELATED APPLICATION DATA

This application is a continuation in part of U.S. patent application Ser. No. 13/765,404, filed Feb. 12, 2013 (now published as 20130241746). This application claims the benefit of U.S. Provisional Application 61/803,540, filed Mar. 20, 2013.

This application is also related to application Ser. No. 13/586,736, filed Aug. 15, 2012, PCT application PCT/US12/50994 (now published as WO2013/025836), provisional application 61/575,178, filed Aug. 15, 2011, 61/727,050, filed Nov. 15, 2012, and application 61/727,293, filed Nov. 16, 2012. All of the above listed applications are hereby incorporated by reference in their entirety.

TECHNICAL FIELD

The present technology concerns smart grid systems, such as for electric power metering.

INTRODUCTION TO THE TECHNOLOGY

"Smart Grid" technologies offer utilities the opportunity to better generate, manage, control, distribute and secure energy. Energy usage across the globe is expected to rise 35% by 2030, driven by industrialization and economic growth. Given this curve and the need to upgrade national power grids to provide this power, the Smart Grid has international focus on how to use technology to better accomplish these goals.

A core tenet of the Smart Grid is the "Smart Meter." A smart meter is (typically) an electrical meter that records energy usage at a consumer's premise and communicates that data back to the utility for billing purposes and for monitoring. Smart meters are similar to the meters that have proliferated across households in the US for almost a century but include digital display and digital communications capabilities. Advanced Meter Infrastructure (AMI) is the term to describe a collection of smart meters in a service area, and the communication system that connects them to the utility. Because of these communication capabilities, smart meters offer tremendous value in other areas.

These other areas are the subject of this disclosure. One concerns using time and positioning to better empower the utility's operations throughout its service area. Given the fact that these meters can communicate with other nodes inside and outside the service area, namely other meters, network routers, substations, network operations centers, etc., the present technology enables creation of a "service area-wide positioning system" just by watching the communications from these smart meters. The discloser's previous work, embodied in U.S. Pat. No. 7,876,266, shows how networked devices—through their simple acts of communicating—can form a space-time network where devices within the network are inherently location-aware just by act of communicating. This application describes how interfacing with the meter's communication or the meter's metrology board can enable a space-time network through such "PhaseNet" technology.

This space-time network provides asset tracking and management capabilities for the utility or other consumer of the location information. The net effect of this capability is that each smart meter in a utility's service area becomes a "positioning satellite" and can provide location and positioning information for any device within the network. In addition to better tracking assets within the service are, there are other problems within the transmission and distribution (T&D) networks that smart meters with PhaseNet can solve. In this disclosure we disclose how to accurately and economically determine the power phase of an individual premise. Alternating current (AC) is the most fundamental tenets of power generation and distribution in the United States. AC power runs on a 60 Hz cycle which allows power to be transmitted and distributed across three phases: Phase A, Phase B and Phase C. Each premise—whether it is a home or business—will be attached to a power line which is one of these three phases. The problem is that there is no way to automatically determine the phase that any premise is attached to.

Historically this determination has been done manually, requiring utility personnel to individually check each meter for phase determination. This results in tens of millions of dollars in operating costs. It is important for the utility to keep accurate knowledge of which premise is on which power phase, in order to safely and efficiently load-balance the power distribution. When too many premises are on different phases than the utility thinks they are on, load balancing procedures become the right procedures based on the utility's legacy data but very much the wrong procedures for the actual situation. Because of this, improper load balancing in the distribution network inevitably grows, which then leads to transformer failures or worse. Correcting this is therefore an efficiency matter, an economic matter and a safety matter.

One method of solving this phase identification problem is better timing synchronization throughout the AMI network. The AMI network, made up of the Smart Meters in the utility's service area, can communicate from the premises all the way back up to the supervisory control and data acquisition (SCADA) system. These Smart Meters have embedded capabilities that when leveraged can provide the timing synchronization required to provide the utility with the phase intelligence it needs.

The PhaseNet technology, described U.S. Pat. No. 7,876,266, is an accurate and scalable timing synchronization method using wireless networks. Many times an accurate "absolute time" must be disseminated to devices across a large geographic area. Existing methods to do this are with GPS or accurate rubidium clocks, but they have difficulty distributing the required precision due to system, device, economic or environmental limitations.

By leveraging local communications modules on the smart meters themselves, PhaseNet can accurately synchronize the meter's time with the sub-station's absolute time to 5.5 milliseconds and better which is needed to determine the power phase.

A particular method is characterized by processing one or more clock-stamped messages received from one meter, together with zero crossing data generated by the other meter, to determine relative timing between zero crossings of power signals at the two meters. By such arrangement, the power at the first meter is determined to be in phase with, or leading or lagging by 120 degrees, the power at the second meter. Clock-stamping can be by a free-running clock/counter in one of the meters, and indeed, may simply be a count from a counter that counts by increments up to a limit and then resumes counting at zero (e.g., a simple 8 bit or 16 bit counter). Some embodiments offer much greater resolution, to well less than a degree of phase, enabling low cost meters to serve as a distributed network of phasor measurement units.

The foregoing and other features and advantages of the present technology will be more readily apparent from the following detailed description, which proceeds with reference to the accompanying drawings.

DETAILED DESCRIPTION

Onboard a typical smart meter are two primary circuit boards: 1) a metrology board; and 2) a communications board. These communications boards each have their own clock and/or oscillators that can provide count-stamps, which are the raw timing and location information for the PhaseNet algorithms.

In implementation, a network communication script is implemented, for example, from a sub-station. The script looks very similar to the normal 'meter reading' scheduling already happening that routes usage data about the premises to the utility. For example, Sub-station A exchanges several duplex packets with meters B, C and D over a few tens of seconds of time; Meter B duplex exchanges several packets with E, F and G before, during, or after the A exchanges; Meter G duplex exchanges with H and I, same drill, before, during or after. This is consistent with the space-time network description embodied in previous filings by the applicant, mainly U.S. Pat. No. 7,876,266.

At each smart meter or other participating node in the AMI network, a chosen 'counter,' which is typically the oscillator or clock on the transceiver or metrology board, count-stamps incoming and outgoing packets. The communication protocol can also be used as the count-stamping source, much like the Time Synchronization Function (TSF) in the Beacon Frame of a Wi-Fi network. An example of this is described in the applicant's patent publication US 2009/0213828. They also each count-stamp zero crossing (ZCD) of the individual power phase at each smart meter.

Each nodes passes back its collected count-stamp data, eventually getting all data back to a participating node at the sub-station or other location. This is the collective 'Pung' data noted in U.S. Pat. No. 7,876,266.

The sub-station node (or "collection node") sends all Pung data, including metadata indicating which node is the 'master node,' which knows what phase A, B or C it is on, to a PhaseID web service. This web service is simply the raw PhaseNet processing that can be located in the cloud, a data center, locally, etc. The web service calculates inter-counter relationships (i.e. ZuluTime), determines each node's effective count value relative to the master node, then assigns A, B or C to each node based on what phase it has relative to the master node's A, B or C (or all three).

Figure 1:
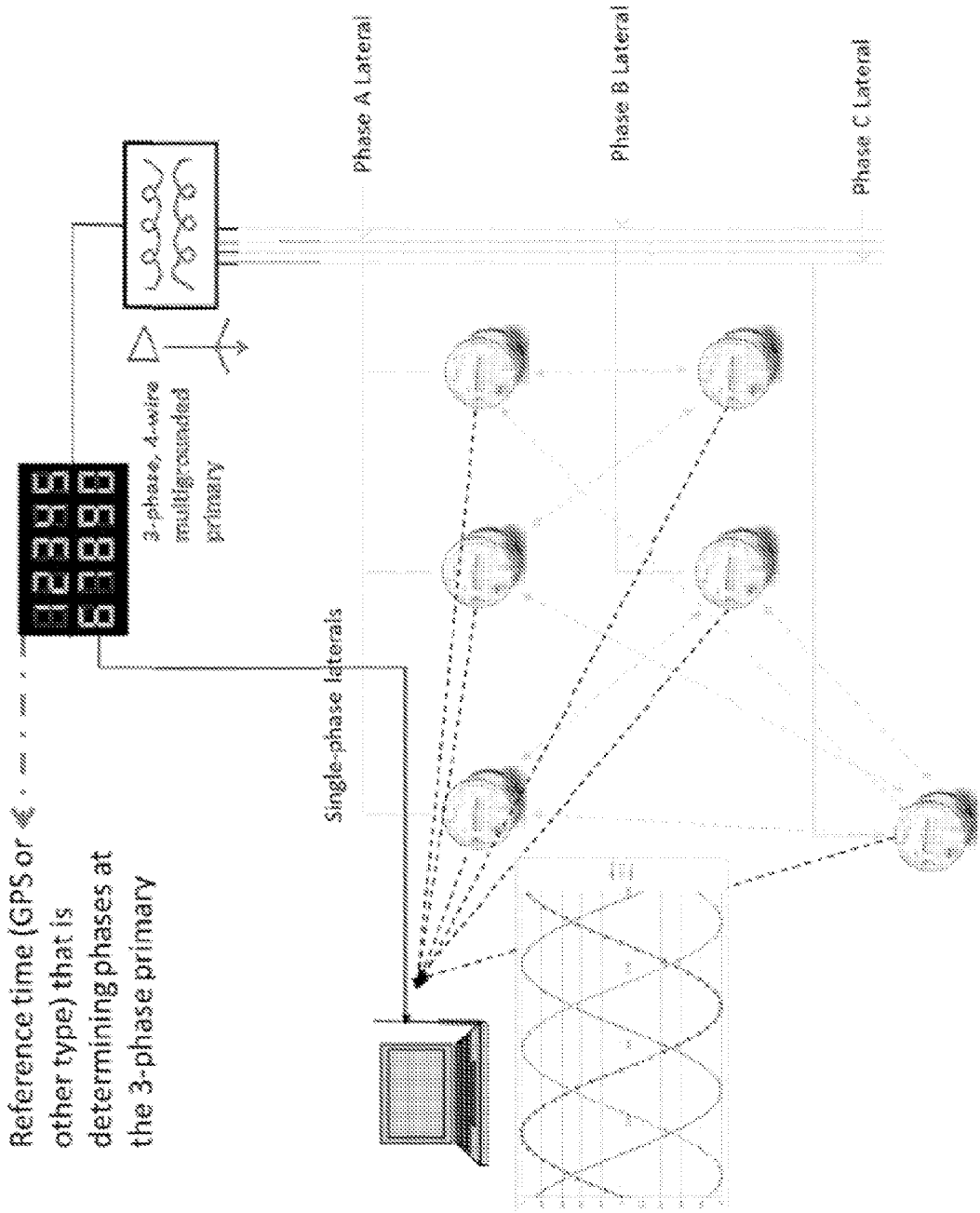
FIG. 1 is a block diagram depicting certain aspects of the present technology.

FIG. 1 describes this chain, where the laptop is acting as both the sub-station node and the processing web service.

Figure 2:
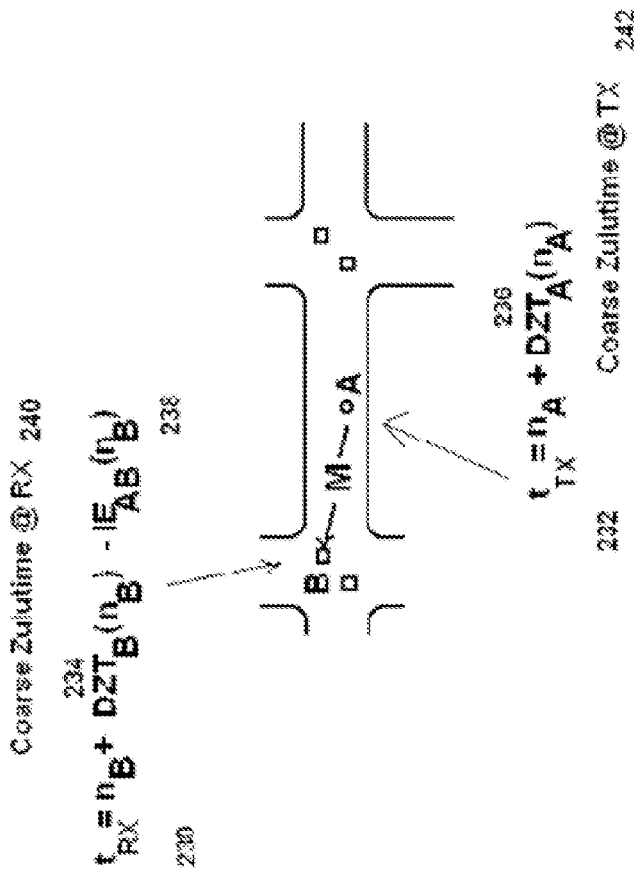
FIGS. 2 and 3 are drawings from pending application Ser. No. 13/179,807, detailing how count-stamps in different devices establish relative timing.
Figure 3:
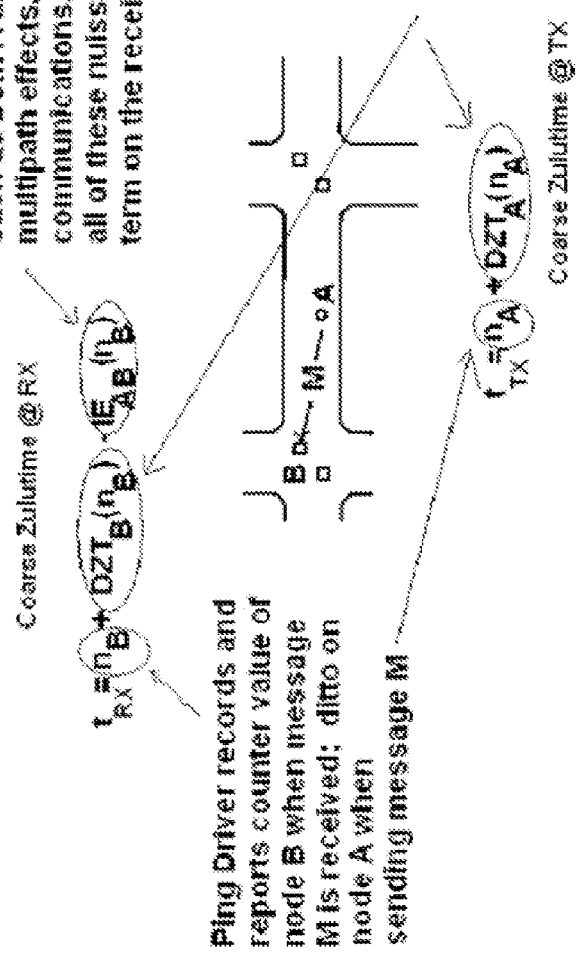

FIGS. 2 and 3 are from the applicant's previous patent filing entitled Location Aware Intelligent Transportation Systems (pending application Ser. No. 13/179,807, filed Jul. 11, 2011, now published as 20120309414, which is hereby incorporated by reference in its entirety), and illustrate after many messages are sent between nodes in a group, one node's counter can be related to any other node's counter via these 'DZT functions,' which is Delta ZuluTime. These are ways of saying "when node N has counter value 3245246830, node M will be having counter value 5662594625," and so forth. The graphic cases are for more complicated cars moving down a street. In the case of smart meters, distances will be fixed and the raw counter values from the smart meter chips will be coarser than in the intelligent transportation case, but they are still adequate to determine sub-millisecond error-bar relationships between meters. Hence PhaseNet relates some given meter in the field and its ZCD counter value to the master counter value at the sub-station.

Patent documents U.S. Pat. No. 7,876,266 and 20090213828 teach how counters and/or clocks on one device can relate their instantaneous values with a second device through the simple act of exchanging packets of communication between the two devices, 'count-stamping' those exchanged packets as they are sent out from one device and/or received by the other device (there are many options described therein, hence the 'and/or').

The present technology can involve smart meters as the communicating devices, adding the step where the smart meter also count-stamps the 60 Hz phase (usually the positive or negative zero crossing) of the electrical supply line to it. In the detailed arrangements, these collective count-stamps are shared and processed, determining the A, B or C status of a given meter, an important parameter that has inspired various higher cost prior art methods to accomplish the same task. By utilizing only existing hardware capabilities of most if not all current smart meters, this technology lends itself toward a de facto lowest cost approach toward accomplishing this goal automatically, not requiring a human visit to any given meter. One configuration posits a computer at some central station collecting area-wide information and thereby determining all the A, B and C phases of meters within its region. A second configuration describes a web service, also known as generic cloud processing, where meters simply send their raw count-stamp data to an IP address, and a computer at that address processes the A, B and C determinations.

Figure 4:
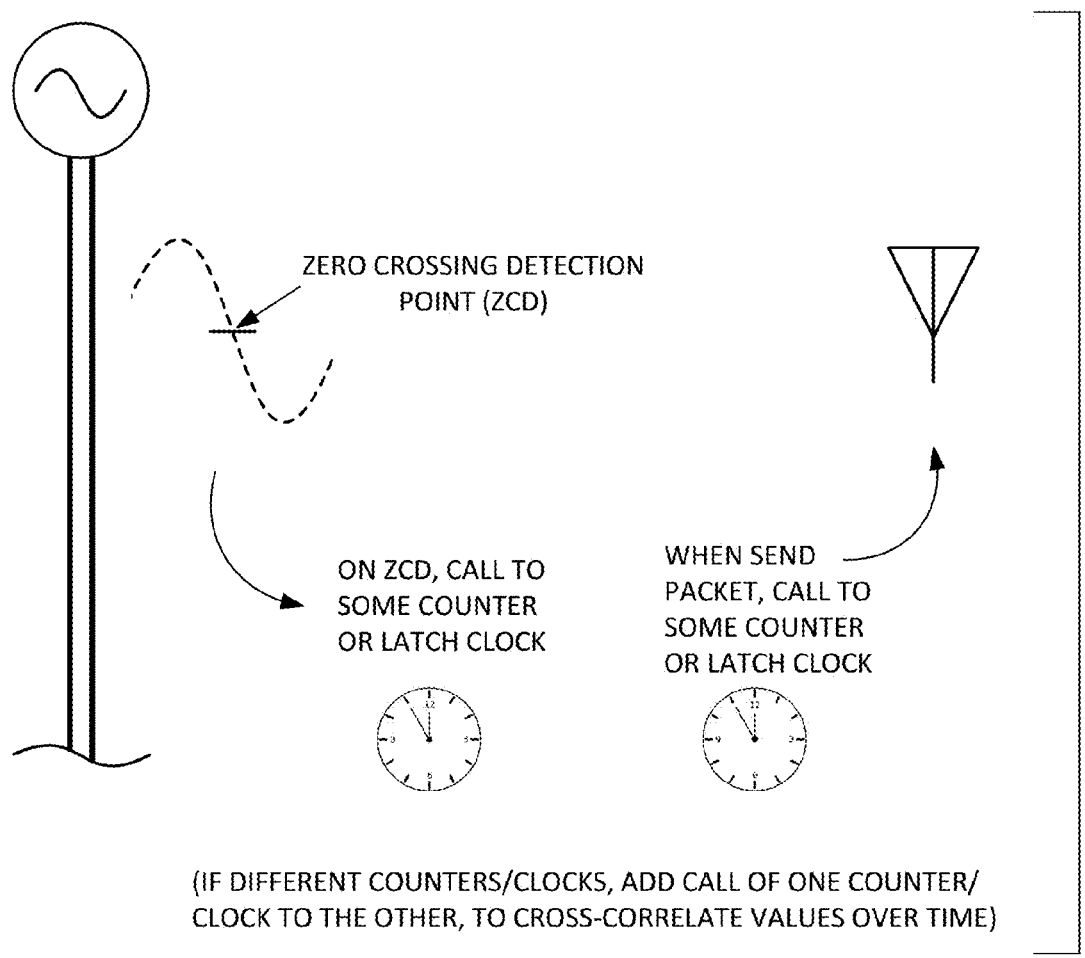
FIG. 4 is a conceptual illustration of one particular embodiment of the present technology.

FIG. 4 depicts one of the aspects of the technology, whereby a counter or clock on a smart meter that measures the phase of electric power (in counts or in 'time') is also used to measure the sending and/or receiving of messages within a communications 'stack.' In smart meters where there are separate counters (or clocks) used to measure these separate items, an additional step of 'correlating the counters' is performed to get to the same end.

Figure 5:
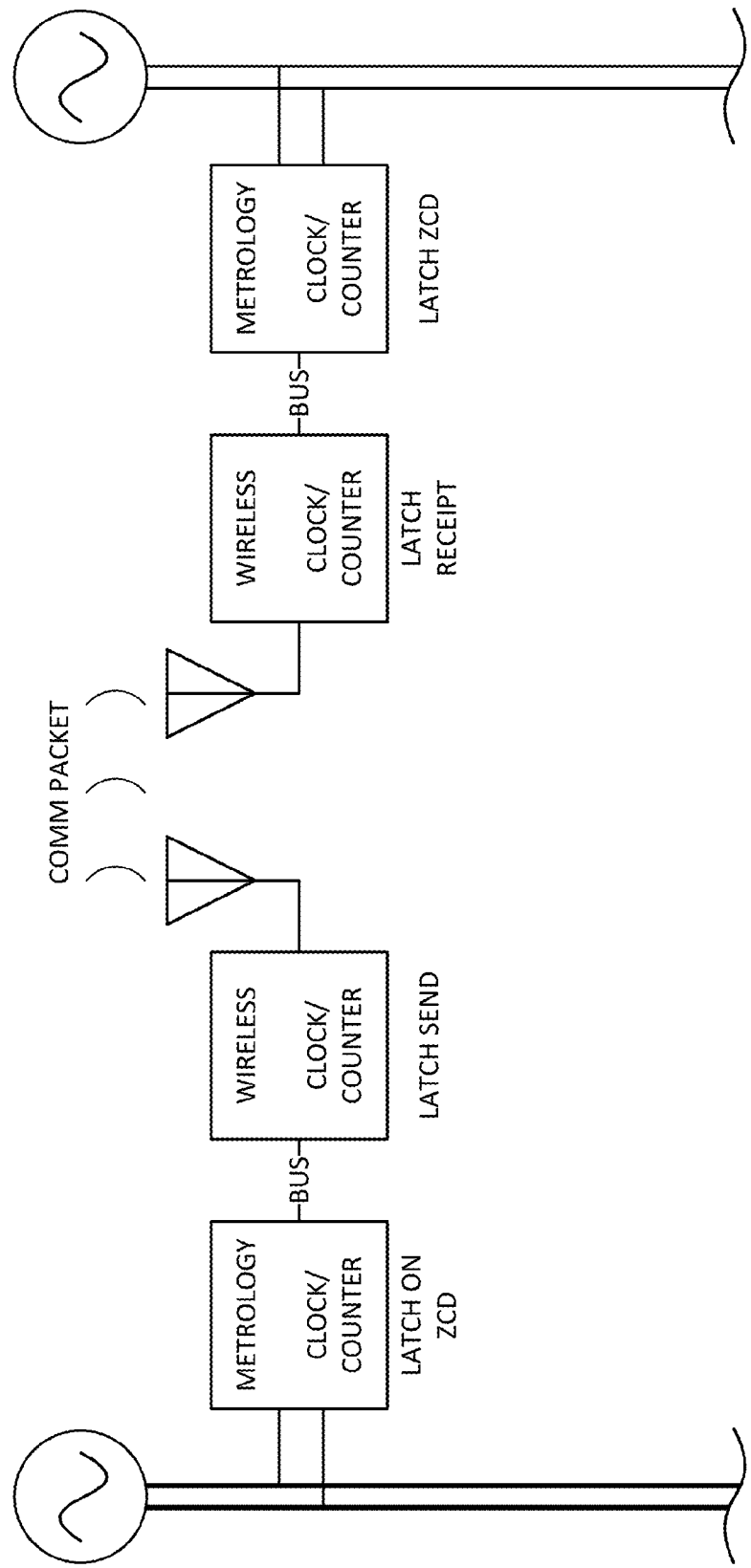
FIG. 5 shows a packet based network involving two devices, enabling their relative power phases to be determined.

FIG. 5 details an illustrative chain of events whereby a smart meter communicates with either a second smart meter or some other device which has its own ability to measure power phase (A, B and C). The core low level goal is to determine if two smart meters thus communicating are on the same phase, or 120 degrees different, one advanced over the other. The core approach is to use a shared message as an arbitrary but useful reference event such that otherwise non-coordinated counters can nevertheless formulate cross-measurements.

Figure 6A:
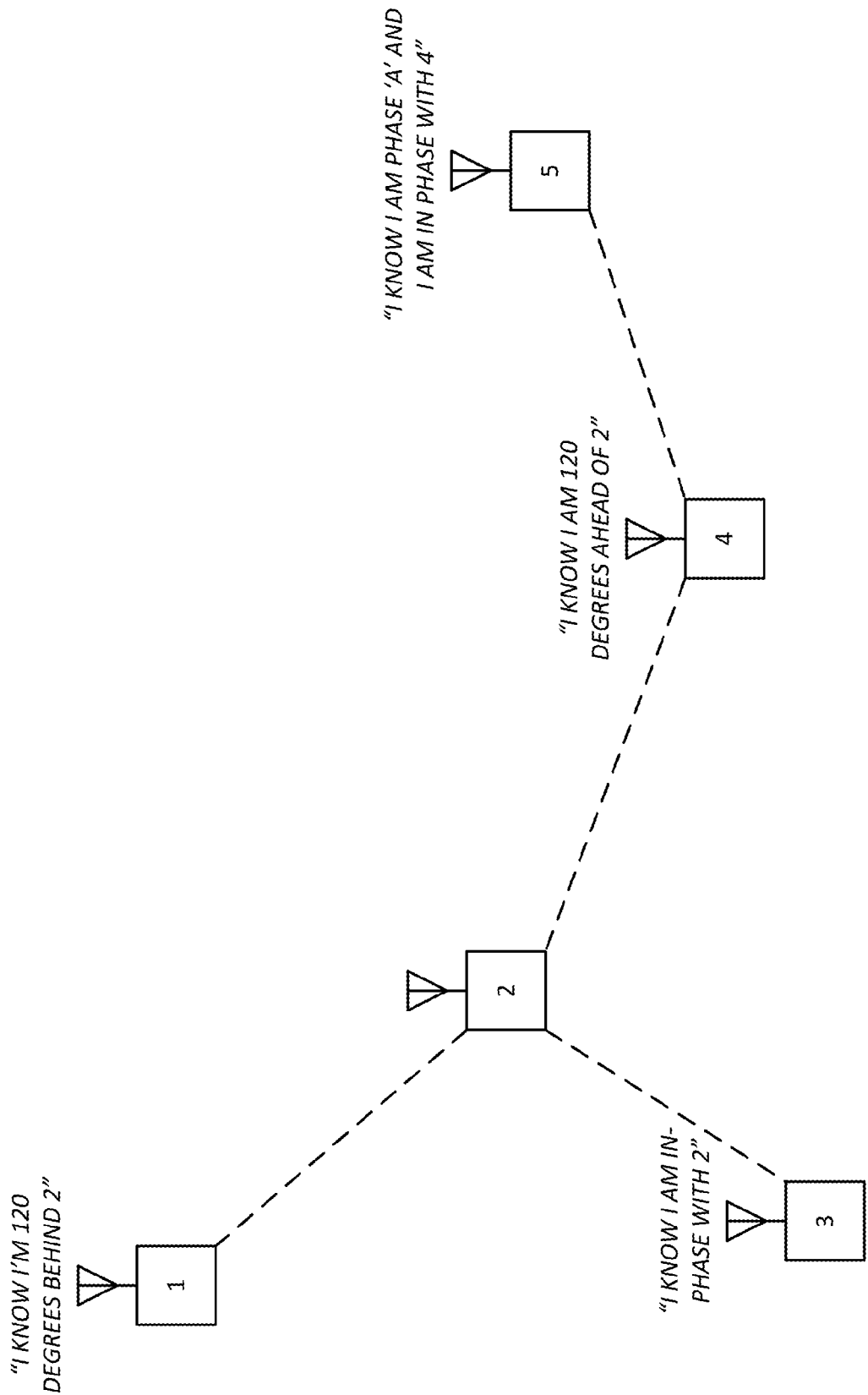
FIGS. 6A and 6B show how differential phase relationships can be resolved into absolute power line phases A, B or C.
Figure 6B:
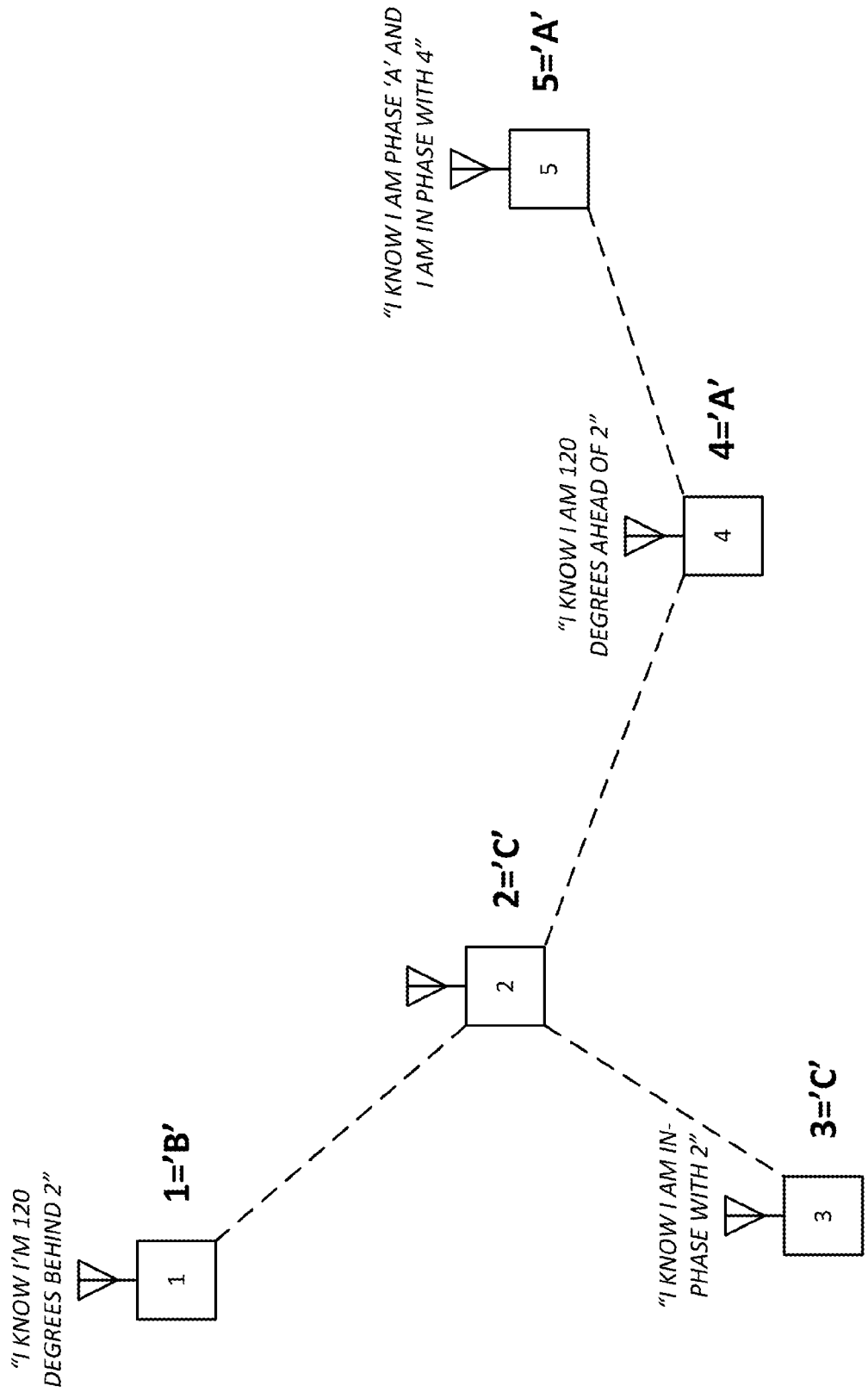

FIGS. 6A and 6B then show that once many smart meters are thus communicating and determining these differential power phase relationships, then all it takes is for one device in the entire group to 'know its phase, A, B or C'—or, for a central power station to be in the group which definitively knows A, B or C—then the knowledge of A, B and C phase can propagate to all devices. In other words, chains of relative knowledge are established, and then these are resolved by introduction of one known datum.

As noted, one implementation of this technology employs a 'web service' with an IP address that acts as a coordinator for some given large group of devices (often including a central power station), minimizing the necessary data generation, packaging and processing steps for individual smart meters. (The web service can be a component of a utility's larger GIS-based asset management system.) A driving idea is to minimize a smart meter's operations to just generating the raw data from the power phase and the communication packets (the pings if you will, with the term 'ping' now being extended to count-stamping power phase zero crossings), then shipping the raw data to an IP address. Other than normal operation health monitoring of its data generation capabilities, the meter's job is essentially then done. This should represent the de facto lowest cost approach to implementing this technology, or possibly any other approach to automatically measuring A, B and C phase of smart meters. The web service can deliver phase data back to the customer meters, and/or to the central office.

The web service approach holds particular appeal for utilities that don't want to be locked into one provider's proprietary solutions. (Often, utilities enter into contracts with equipment suppliers to provide meters over a period of years. After expiration of the contract term, a utility typically wants freedom to migrate to another supplier without technical impediments.) A disconnection between the supplier of smart meters, and a service that assists in automatically determining the A, B and C phases of such meters, may be one of several approaches to dealing with this tension. Thus, desirably the technology is implemented in a fashion in which data generation at the smart meter is standardized, and is able to be shipped to some third party-run service, as opposed to being slaved to (monopolized by, critics might charge) some proprietary service. Moreover, as newer smart meters are integrated into the grid over time, they can leverage communication from un-cooperating meters that simply report measurements, but may not reliably provide packet count stamping.

The artisan will further recognize that constant measurements of A, B and C phases on individual smart meters is generally not needed, and economical models of sampling can be developed to help utilities and their customers pay only for the phase determinations that are deemed necessary on daily, weekly and monthly bases, or based on events.

A common event scenario is a storm that brings down power lines throughout a service area. Sometimes utilities call on service personnel from other utilities—sometimes from other states—to try and restore power as soon as possible. In such circumstances, visiting lineman crews that are working amidst a storm to restore power to dark neighborhoods aren't likely to be concerned about load balancing among the utility's A, B and C phases. If a line has power, they'll connect to it.

After repairs have been made, the utility can poll the meters to determine relative power consumption on the A, B and C phases. This determination can be made based on many hierarchies of geography—within a neighborhood, within a substation's service area, etc. Desirably, balance (⅓-⅓-⅓) is achieved at each level. Imbalances can be corrected in a more leisurely period after the storm, by dispatching crews to switch certain customers to certain phases, as needed.

(Load balancing is not only a concern to utilities in managing efficient power distribution across a power grid. Industrial consumers also have substantial economic interest in receiving balanced three-phase power supply. Industrial sites typically employ three phase power to operate expensive capital equipment, such as industrial generators. When the three phases of the power supplied to such equipment is even somewhat out of balance, such as 30%, 35%, 35%, the useful life of this equipment has been shown to be significantly reduced.)

Such a charge-as-required model for determining meter phase helps placate profit-wariness within a highly scrutinized market, yet allows for companies to commercially operate. This model is also generally preferable to vendors of smart meters, since it does not burden such costs onto the upfront meter cost.

As noted, patent documents U.S. Pat. No. 7,876,266 and 20090213828 describe in great detail how local counters and/or clocks on devices can latch instantaneous datum upon either the sending or receiving of RF-domain communication packets. An example of such a communications-equipped meter is the Silver Springs NIC 300 family of products. To the extent current and future smart meters utilize packet-based communications, these same approaches to count-stamping data communications can be used in this technology.

Example use of 'clocks' might be as simple as generic software calls for 'time of day' or TOD when one is integrating several individual integrated circuits to make up a fully packaged 'smart meter.'

Other suitable platforms include the 1-210+, SGM3000 and EPM6000 families of smart meter products by General Electric Company.

An aspect of certain embodiments of this technology is to correlate electrical power phase events (often referred to as zero-crossing data or ZCD) to these communications events (transmits and receives of communication data packets, a.k.a. 'pings' in the referenced patents).

An example is where a given counter on a first device is running at roughly one million counts per second. 'Roughly' is used in deference to typical 'PPM' or parts per million deviations of actual counters/clocks about some perfect number of counts per second (as if calibrated by an atomic clock). An incoming message packet might be recorded at some number, say 123000000. Then, some ZCD event on the electrical power waveform may be recorded at some other moment, say 123456789. This ZCD event was thus 456,789 counts different than the receipt of some arbitrary communications packet. This would be 'roughly' 0.457 seconds later. For determining A, B and C phases, one will find that many of these 'roughly' kind of situations are just fine.

This correlation of a single (and random) incoming message event with a ZCD doesn't reveal much on its own. But this information can be compared to what a sending device (also with a 'roughly' 1 million count per second counter) may have done prior to sending that message to our first device. We can imagine that this second device recorded a 987000000 count on one of its ZCDs, then recorded that it sent out the message packet at counter value 987544000. Thus, device 2's ZCD was 544,000 counts off from when it sent out the message packet.

Light travels roughly 300 meters for every count of each device's counter, so assuming the devices in question are within a few kilometers of each other, the delay due to light travel is effectively nil (a few dozens of count values, or tens of microseconds, at best).

The simple math problem is thus set up whereby device 2's ZCD was roughly 0.544 seconds before the sending of a message, and device 1's ZCD was roughly 0.457 seconds after the sending of that very same message. This indicates that Device 1's ZCD is occurring roughly 1.001 seconds after Device 2's ZCD.

Those practiced in the art of A, B and C phase measurement know that, for example, all meters on phase A will have ZCD's roughly in synchrony every 16.6 milliseconds, or 0.0166 seconds. This is the reciprocal of 60 Hz. If another meter is on phase B or C, there will be a 5.55 millisecond lead or lag from this 16.6 ms synchrony. In our example above, 1.001 second is very close to the predicted 1.000 seconds that would occur assuming device 1 and 2 are on the same phase.

The also simple mathematical operation is then to determine whether device 1 is one-third power cycle ahead of device 2, in phase with it, or one-third power cycle behind device 2. The math formula for doing this is simply:

Mod Delay=60*Mod(Delay,1/60); where Mod is the modulo operation;

Where the delay value of 1.001 above would give Mod Delay=0.001*60=0.06; values from this formula should accumulate around the values 0, 0.333 and 0.666.

The upshot, after the two devices thus communicate, is that we can now separate the two devices into three classes based on Mod Delay:

A:A or B:B or C:C for Mod Delay~0.000, device 1 relative to device 2 power phase
A:C or B:A or C:B for Mod Delay~0.333, device 1 relative to device 2 power phase
A:B or B:C or C:A for Mod Delay~0.666, device 1 relative to device 2 power phase The foregoing reveals the phase relationship between the two devices, but not their absolute phases. The simplest way for determining absolute phase is for one of the devices to be at a central station and thereby simply 'know' what phase it is on, then it can look to the above guide to determine the other device.

More generically, you have the situations depicted in FIG. 6A, where you can accumulate many of these 'relative' relationships, then once a single member in an entire group determines is absolute phase A, B or C, this knowledge then instantly can propagate to determine all other absolute phases (as shown in FIG. 6B).

The specific example above had a 0.001 second deviation from the perfect value of 0.000 for a Mod Delay. This was deliberate for the example, pointing out that there will be a variety of error sources, delays, noise, etc. involved with these measurements. Typically, such combined errors will not accumulate to the point of major obfuscation between the 0, 0.333 and 0.666 bins, but in the case where such errors may thus accumulate, multiple measurements are desirably made to help unequivocate the Mod Delays between two given devices.

(The threshold for ambiguous cases can be a utility-set parameter. Typically, two or three standard deviations may be a suitable range. Any Mod Delay outside that range is further analyzed by reference to timings involving one or more other devices. These errors can also be dealt with using various filtering, modeling, averaging, and least squares estimation error minimization functions. Kalman decomposition is another approach to addressing such error phenomena.)

While in the example just given, the second device transmitted its clock-stamped packet 0.544 seconds after it detected a zero crossing, the device may instead may be configured to transmit its clock-stamped packet immediately after it detects a zero crossing. While receipt of this message by the first device isn't exactly synchronous with the detected zero crossing at the second device, the delay may be short enough to be disregarded—further simplifying the math.

In any case, it will be recognized that a single transmit/receive event of a single message serves as a temporary and arbitrary shared reference between two devices, allowing them to derive modulo phase measurements. Receive-only approaches also exist where the first device can also send a message to the second device for a duplex coordination of internal counter values based solely on received pings.

Web services like that conceived for the present technology have application in other areas as well. For example, the PhaseNet technology detailed in the cited patent documents can be implemented in a web services model for location determination. Individual nodes report elemental data to a central server, which processes the received data to identify the location of each node. Here, as there, a driving idea is to minimize the functional requirements of what exactly a smart meter needs to do in order to enable this technology, keeping its task to just generating, packaging and shipping data to an IP address. Previous discussions have gone in the 'generating' part of that statement.

Desirably, the collected data is packaged into some standardized format for delivery to a smart-meter dedicated web service that determines A, B and C phases for a very large number of client devices. The transmission of this data would utilize the standard communications that the gives the smart meter the first part of its name: 'smart.' Typical amounts of data to be transmitted are in the few kilobyte range at most, except where there is a great deal of noise/error in the system and larger amounts of data may be necessary.

Figures 7, 9:
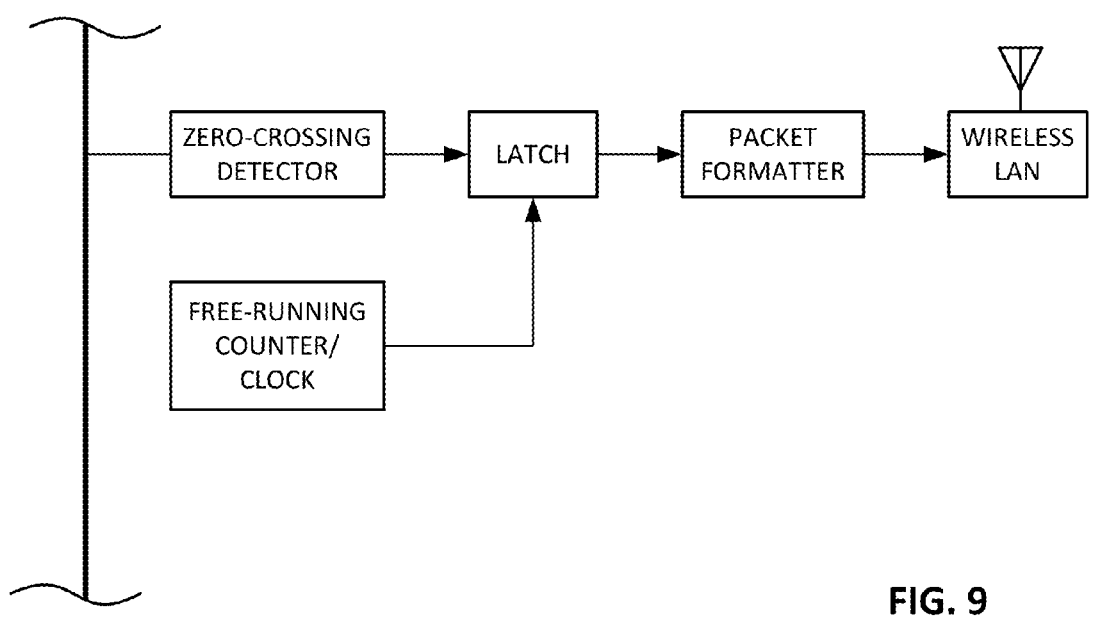
FIG. 7 illustrates aspects of a data packet.
FIG. 9 shows an arrangement by which an output from a free-running counter/clock is latched when a zero-crossing detector senses a zero-crossing.

The details of a particular transmission format are dependent on the implementation context and system particulars; definition of same is within the capabilities of the artisan. An exemplary packet body format (i.e., not including header information—such as address data, framing data, error correction data, etc.) is shown in FIG. 7. Included are fields for data specifying the identity of the sending device, the location of the sending device (optional), and the measurement data being relayed (e.g., count-stamp information). Also included are security data (e.g., specifying the use to which the packet data can be put—such as a reference to applicable privacy rules), and other network and administrative data (e.g., battery state). In some implementations, the packet is encrypted. (Some packet formats can represent data in plural different manners, to accommodate customizations or extensions by different equipment suppliers.)

A similar packet arrangement can be employed for data sent to the power meters.

The contents of these fields can be data, or they can be links (e.g., URLs or other pointers) to data that is stored elsewhere and accessible to the receiving station.

Figure 8:
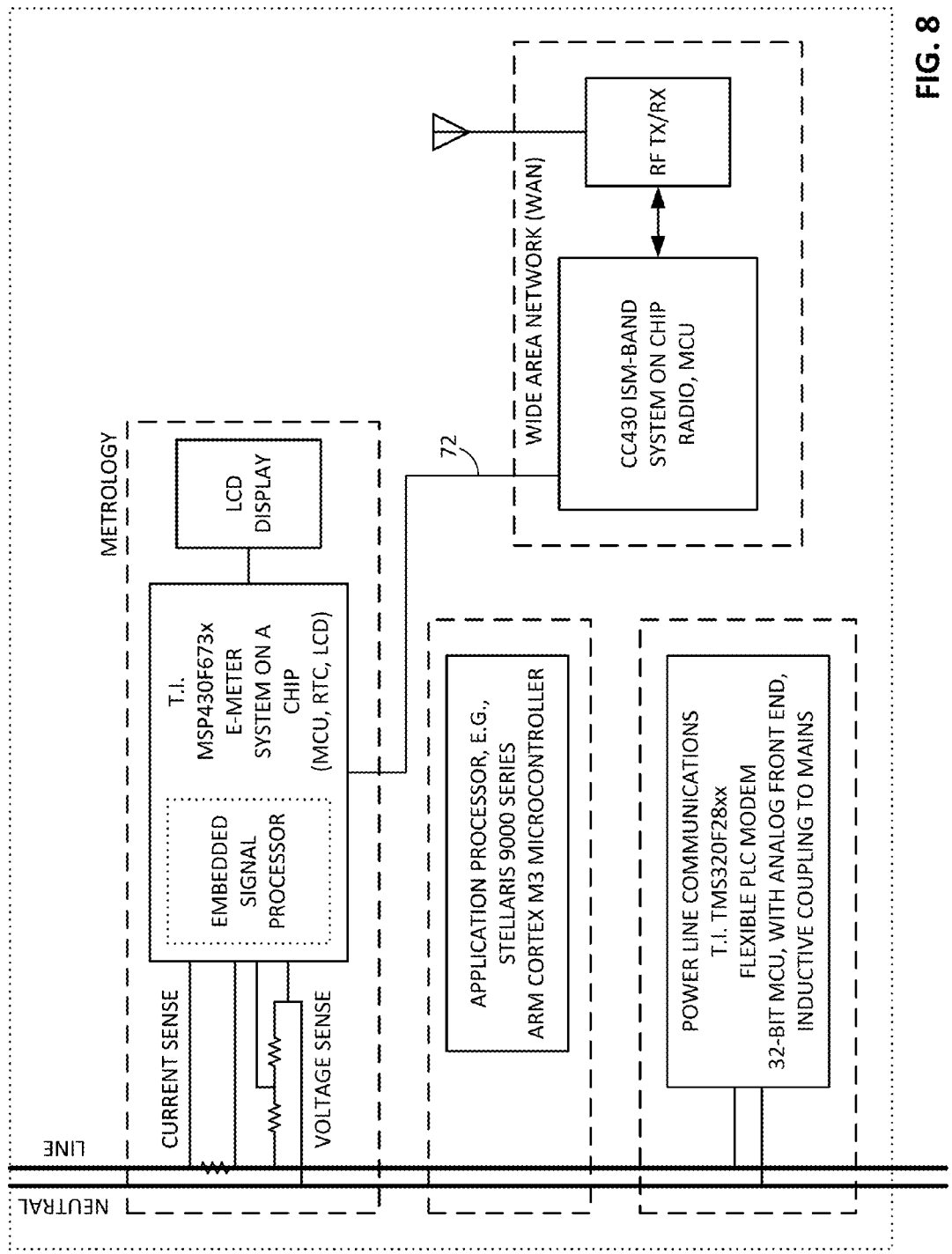
FIG. 8 is a diagram of a smart power meter than can be used in embodiments of the present technology.

FIG. 8 is a diagram of a representative smart power meter. This diagram is based on a reference design published by Texas Instruments (c.f., Smart Grid Solutions, Texas Instruments, 2012), using various system-on-a-chip components. Included are the MSP430F673x single phase electricity metering (metrology) chip, the Stellaris 9000 series ARM Cortex M3 microcontroller, the TMS320F28xx power line communication chip, and the CC430F6135 (or CC430F6137) microcontroller with integrated radio transceiver (communications) chip. Texas Instruments publishes extensive literature to guide the artisan in the use of such components.

Not part of the TI smart meter reference design in FIG. 7 is the data channel 72. This link is provided in some embodiments to enable zero crossings detected by the metrology system to be count-stamped by reference to the same clock that count-stamps packets sent/received by the communications system (or vice versa). While not essential, the use of a common count-stamp for all such events offers a bit of simplification. (Indeed, if the relationship between the zero crossing count and the time reference of the packet sender are known, it is sufficient to share zero crossings and monitor the relationship of zero crossings between meters. Errors introduced by such variations in packet transmit times can be averaged out, modeled and removed, etc., as noted in other discussions about dealing with errors.)

Without a link 72, zero crossings can be count-stamped by reference to a clock in the metrology unit, and packets can be count-stamped by reference to a different clock in the communications unit. Desirably in such embodiments, provision is made to periodically check the delay in relaying such data between the units, since the existing data bus connecting the different blocks in FIG. 8 (not particularly shown) is subject to bus state delays, and is used to convey a variety of other traffic.

Another vendor of system-on-a-chip components for smart meters is Maxim Integrated Products, whose offerings include the MAX71020 analog front end system, and the 71M6000 series of chips.

In some implementations, count-stamp data generated in the metrology and/or communication units is buffered in memory provided in that unit, available for read-out when called for (such as in an asynchronous mode, where relative timing is derived by also tracking packet send or receive counts). In other cases, the count stamped zero crossing are measured with a time base that is synchronous with message transmission (i.e., two separate count stamps, one for zero crossing and one for message sending. are not always required).

FIG. 9 shows an arrangement including a power line, a zero-crossing detector, a free-running counter, and a latch circuit, a packet formatter, and a wireless transmitter. When the zero-crossing detector senses a zero-crossing, it produces an output signal. This signal triggers the latch circuit, causing it to capture and store whatever value the counter output at that instant. The latched count output is provided to the packet formatter for inclusion in a data packet. This packet is transmitted by the LAN, e.g., to another device (e.g., power meter) or web service.

The counter and latch circuit of FIG. 9 can be in the metrology unit, but needn't be so. For example, the output from the zero-crossing detector can be communicated to a counter unit elsewhere in the system (e.g., in the WAN).

In embodiments in which the counter and latch are in the metrology unit, the link between the latch and the packet formatter needn't be direct. For example, the latched value can be communicated across a system bus.

Introduction to Phasor Measurement Units

Phasor measurement units promise to revolutionize electric power systems. The remainder of this section reproduces the current Wikipedia article on the subject:

A phasor measurement unit (PMU) or synchrophasor is a device which measures the electrical waves on an electricity grid, using a common time source for synchronization. Time synchronization allows synchronized real-time measurements of multiple remote measurement points on the grid. In power engineering, these are also commonly referred to as synchrophasors and are considered one of the most important measuring devices in the future of power systems. A PMU can be a dedicated device, or the PMU function can be incorporated into a protective relay or other device.

A phasor is a complex number that represents both the magnitude and phase angle of the sine waves found in electricity. Phasor measurements that occur at the same time are called "synchrophasors," as are the PMU devices that allow their measurement. In typical applications phasor measurement units are sampled from widely dispersed locations in the power system network and synchronized from the common time source of a global positioning system (GPS) radio clock. Synchrophasor technology provides a tool for system operators and planners to measure the state of the electrical system and manage power quality. Synchrophasors measure voltages and currents at diverse locations on a power grid and can output accurately clock-stamped voltage and current phasors. Because these phasors are truly synchronized, synchronized comparison of two quantities is possible, in real time. These comparisons can be used to assess system conditions.

The technology has the potential to change the economics of power delivery by allowing increased power flow over existing lines. Synchrophasor data could be used to allow power flow up to a line's dynamic limit instead of to its worst-case limit.

In 1893, Charles Proteus Steinmetz presented a paper on simplified mathematical description of the waveforms of alternating electricity. Steinmetz called his representation a phasor. With the invention of phasor measurement units (PMU) in 1988 by Dr. Arun G. Phadke and Dr. James S. Thorp at Virginia Tech, Steinmetz's technique of phasor calculation evolved into the calculation of real time phasor measurements that are synchronized to an absolute time reference provided by the Global Positioning System. Early prototypes of the PMU were built at Virginia Tech, and Macrodyne built the first PMU (model 1690) in 1992.

A phasor network consists of phasor measurement units (PMUs) dispersed throughout the electricity system, Phasor Data Concentrators (PDC) to collect the information and a Supervisory Control And Data Acquisition (SCADA) system at the central control facility. Such a network is used in Wide Area Measurement Systems (WAMS), the first of which was begun in 2000 by the Bonneville Power Administration. The complete network requires rapid data transfer within the frequency of sampling of the phasor data. GPS time stamping can provide a theoretical accuracy of synchronization better than 1 microsecond. "Clocks need to be accurate to ±500 nanoseconds to provide the one microsecond time standard needed by each device performing synchrophasor measurement." For 60 Hz systems, PMUs must deliver between 10 and 30 synchronous reports per second depending on the application. The PDC correlates the data, and controls and monitors the PMUs (from a dozen up to 60). At the central control facility, the SCADA system presents system wide data on all generators and substations in the system every 2 to 10 seconds. PMUs often use phone lines to connect to PDC, which then send data to the SCADA or Wide Area Measurement System (WAMS) server.

PMUs from multiple vendors can yield inaccurate readings. In one test, readings differed by 47 microseconds—or a difference of 1 degree of at 60 Hz—an unacceptable variance. China's solution to the problem was to build all its own PMUs adhering to its own specifications and standards so there would be no multi-vendor source of conflicts, standards, protocols, or performance characteristics.

The Bonneville Power Administration (BPA) is the first utility to implement comprehensive adoption of synchrophasors in its wide-area monitoring system. Today there are several implementations underway.

The FNET project operated by Virginia Tech and the University of Tennessee utilizes a network of approximately 80 low-cost, high-precision Frequency Disturbance Recorders to collect synchrophasor data from the U.S. power grid.

In 2006, China's Wide Area Monitoring Systems (WAMS) for its 6 grids had 300 PMUs installed mainly at 500 kV and 330 kV substations and power plants. By 2012, China plans to have PMUs at all 500 kV substations and all power plants of 300 MW and above. Since 2002, China has built its own PMUs to its own national standard. One type has higher sampling rates than typical and is used in power plants to measure rotor angle of the generator, reporting excitation voltage, excitation current, valve position, and output of the power system stabilizer (PSS). All PMUs are connected via private network, and samples are received within 40 ms on average.

The North American Synchrophasor Initiative (NASPI), previously known as the Eastern Interconnect Phasor Project (EIPP), has over 120 connected phasor measurement units collecting data into a "Super Phasor Data Concentrator" system centered at Tennessee Valley Authority (TVA). This data concentration system is now an open source project known as the openPDC.

The DOE has sponsored several related research projects, including GridStat at Washington State University.

Applications include:
1. Power system automation, as in smart grids
2. Load shedding and other load control techniques such as demand response mechanisms to manage a power system. (i.e. Directing power where it is needed in real-time)
3. Increase the reliability of the power grid by detecting faults early, allowing for isolation of operative system, and the prevention of power outages.
4. Increase power quality by precise analysis and automated correction of sources of system degradation.
5. Wide Area measurement and control, in very wide area super grids, regional transmission networks, and local distribution grids.

The IEEE 1344 standard for synchrophasors was completed in 1995, and reaffirmed in 2001. In 2005, it was replaced by IEEE C37.118-2005, which was a complete revision and dealt with issues concerning use of PMUs in electric power systems. The specification describes standards for measurement, the method of quantifying the measurements, testing and certification requirements for verifying accuracy, and data transmission format and protocol for real-time data communication. The standard is not yet comprehensive—it does not attempt to address all factors that PMUs can detect in power system dynamic activity.

Other standards used with PMU interfacing:
OPC-DA/OPC-HDA—A Microsoft Windows based interface protocol that is currently being generalized to use XML and run on non-Windows computers.

IEC 61850 a standard for electrical substation automation
BPA PDCStream—a variant of IEEE 1344 used by the Bonneville Power Administration (BPA) PDCs and user interface software.

From A, B, C Phase Determination to Phasor Measurement Units (Synchrophasors)

From the Wikipedia excerpt, above, it will be recognized that existing deployments of PMUs have been limited to tens of units or, in the case of the US Eastern Interconnect Phasor Project, 100+ units. The limited deployment is due to the expense of the component units—commonly in the tens of thousands of dollars each.

The present technology can make each power meter a PMU, enabling vast networks of PMUs—alerting utilities to small, isolated deviations from nominal conditions, long before they start aggregating into large oscillatory deviations that progress into blackouts.

One simple sentence tells how this is done: Tighten up on the timing noise and timing cross-correlations between measurements of zero crossings and the measurements of communication pings!

Following the prescription of this last sentence, and following the various approaches toward better timing solutions between spatially separated communicating devices, the sub-millisecond accuracy requirement of A, B C determination can move down toward microsecond and sub-microsecond level accuracies necessary for high quality PMU implementations.

As noted above, PMUs presently make heavy use of GPS. This does not need to be the case once better de facto timing is built into a given communication network. The prognosticated growing importance of PMU's to the overall evolution of the 'Smart Grid' will no doubt take a new leap forward once each and every edge smart meter can be an effective PMU as well.

To further describe just exactly what 'tighten up on the timing noise and timing cross-correlations . . . ' actually entails, consider the following general comments followed by some details. The primary task at hand is to 'correlate' a) the time-stamping and/or count-stamping of the power phase inside a metrology unit, to b) the sending and/or receiving of communications packets by a wireless unit inside a smart meter. In 2012, these separate units are generally connected by a logical bus not inclined toward nor designed for precise correlation of these separate events (power phase, and packet transmission/reception). Beyond 2012, they need to be better correlated in order to reach the full potential of PMU performance and the sub-microsecond UTC calibration which is inherently possible. One simple approach to ensuring this correlation is to create a pulsing circuit inside the metrology unit such that the wireless unit can directly sense a ZCD pulse using its own counter. This does not lend itself well to 'retrofitting' currently shipping smart meters, however. A separate approach which does lend itself to retrofitting current commercially available smart meters is to collect a large but not enormous set of count-stamp/time-stamp data from the metrology unit on the power phase, and to likewise send a large set of pulsing signals over the logical bus connecting a metrology unit indirectly with the wireless unit, then have the wireless unit count-stamp/time-stamp such a large set of bus signals. The numbers of events here may range into the hundreds or thousands to enable standard averaging techniques for honing in on the critical correlation between the mechanism that latches data for power phase with the mechanism which latches data for the packet communications. At the end of the day, a single master clock (oscillator) serving an entire smart meter can also form the basis for this need for correlating power phase with communication packets. In all of these approaches, the sub-microsecond recommendations for high quality PMU measurements should dictate design choices. Patent documents U.S. Pat. No. 7,876,266 and 20090213828 already have explained how nanosecond-scale correlations can be achieved in and between member devices of a communicating network; the engineering task here is to extend at least sub-microsecond-scale accuracies and precision to the 2012-era disconnected operations of measuring power phase and measuring timing of packet transmission/receipt.

Indeed, the entire area of 'tightening up' noise and error sources is rich and diverse. Redundant measurements with subsequent filtering from common types to Kalman, even, all can play a role to achieve sub-microsecond specifications.

This area will be dominated by the 'retrofit' problem, and less of a concern for 'next gen' designs where cross-correlation (or slaving to a single system master oscillator) will become a design requirement harkening several standard cross-unit solutions generally by-passing a logical bus. The 'retrofit' problem, as stated above, will no doubt bottom out on a case by case basis where the detailed capabilities of IC's and bus characteristics will need to be examined, along with a healthy regimen of empirical testing. Another area for known reduction in error is classic calibration of 'fixed delays' both within a smart meter itself and from one smart meter to another. Both the 'light distance' delay between two meters, and the inevitable circuit delays in RF communications circuitry, all can be measured and removed, as is familiar to artisans.

Whole neighborhoods hanging on a single sub-station can aggregate PMU measurements for very early warning detections of load problems that might otherwise lead to power outages. Likewise, with relatively routine sending of low-level PMU data from edge-points to processing points in the cloud, 'dying breath' anomalous conditions sensed by a smart-meter-qua-PMU can be still sent (perhaps via N-second power back-up) to some neighbor device and still to some point in the network cloud for rapid determination of fault points in the power grid.

The 2012 state of the market witnesses several suppliers of commercial PMUs and a robust growth in their use. Examples include the MacroDyne Model 1690, the RES521 by ABB Ltd., and the SEL-487E by Schweitzer Engineering Laboratories.

Following the prescriptions of this technology and furthermore following the simple statement above of paying more attention to the counter-correlation between ZCD (or power waveform in general) measurements, and RF-packet sending and receiving, the hallowed 1 microsecond (arbitrary 'guideline' for PMU performance supported by numerous studies and well within the capabilities of well-executed distributed GPS approaches) can easily be achieved across an entire metropolitan area. More classic (read: existing dedicated and more expensive PMUs of today) can then cross-correlate one metropolitan region to others. The upshot is that the prospect for a detailed understanding of the instantaneous phasor relationship between some random household in Sheboygan with some equally random household in Chula Vista becomes possible with this technology. Ultimately, meter-level positioning of each and every smart meter will assist in removing 'known delay' characteristics, as inevitably 1 microsecond target system specifications drive down to 100 nanoseconds and then probably further down.

Graphic visualization of region-wide instantaneous phasor performance, aggregating hundreds of thousands or millions of smart meters in a given very large metropolitan area, will surely lead to new diagnostic capabilities for both outage-prevention and post-outage analysis. Visualization with roughly a one to two second lag, across an entire metropolitan area, should be realistic utilizing a web service approach to wide area service, today generally referred to as Supervisory Control and Data Acquisition (SCADA).

When graphic visualization graduates beyond simply having a human operator monitor a region for problems, to becoming a powerful new automated network fault prevention tool, is when two-dimensional signal processing is applied to both a) geographic-variable synchrophasor realtime data and b) powerline-delay-adjusted realtime synchrophasor data. The former case is where, for example, phase deviation about the regional average is plotted as a direct function of physical geography of the underlying meters, creating a classic two-dimensional signal with non-uniform support of that signal (the random placement of smart meters). The latter case is where precise or semi-precise (maybe errors in the several tens of meters) powerline delays are accounted for in laying our smart meters in an abstracted 'delay distance from a central station' as a radial component, and delay distance from each other as a loose kind of angular component. This latter form of two dimensional signal representation can help highlight the propagating wave nature of certain anomalies, especially of the single-fault variety (think wave ripples of the old stone dropped in a pond). By laying out these signals in such a 2-dimensional fashion, region-based anomaly detection as well as phase-maintenance algorithms can then be applied for those two opposite cases (tracking down anomalies as they are about to occur or have occurred, versus regulating a network in ways that keep anomalies at bay in the first place). One point is that 'graphics' are not simply for human visual monitoring, they can form a GIS-like basis, both geographic and 'network-view,' for advanced control and analysis.

From the foregoing, it will be recognized that embodiments employing aspects of the technology use communication systems already in place in smart meters, together with local counters/clocks and the data that they produce. These elements enable simple and reliable sensing of A/B/C phasing, synchrophasor measurements, and/or position determination—all without requiring GPS receivers.

Additional Benefits of Low-Cost Proliferation of Sub-Microsecond Timing Calibration Across Smart Grids As previously discussed, the idea of placing a GPS receiver at each and every salient point in an electric power distribution network (generation, distribution lines, regional stations, sub-stations, distribution boxes, etc.), and placing a GPS receiver at every "smart meter" representing the power consumption nodes in a network, carries with it the potential for numerous benefits, several of which have already been described (A, B, C phase determination, locating of such nodes, distributed power phasor measurement, etc.). Also as previously discussed, physical GPS receivers and their associated antenna placement requirements, power consumption, parts costs, integration costs, maintenance costs, etc., all combine to largely offset the potential benefits of ubiquitous timing calibration, for, if such were not the case, GPS receivers would already be deployed across the Grid. One aspect of this technology achieves massive reduction in such costs by obviating the need for GPS receivers, and letting the existing communications infrastructure do the work—relegating the salient nodes in the network to the task of very simple data collection (e.g., count-stamping communication packets and power phase/ZCD) with subsequent data-packet transmission, nearly identical in nature to the most common operation of "read the meter and transmit the results" that nodes and smart meters routinely perform.

The next part of this disclosure delves further into addition benefits that ubiquitous and nearly-free sub-microsecond calibration of smart grid nodes (including smart meters) affords.

Although a preferred embodiment for implementing these innovations utilizes the communication channel approaches previously outlined, it should be born in mind that placing GPS receivers on Smart Grid nodes and smart meters is a viable alternative to utilizing the communication channels. This is explicitly stated with the idea that GPS capabilities represent a higher cost structure than the communication-channel approach, but this may not necessarily always be the case if GPS costs continue to steeply commoditize. In such case, a GPS receiver enabled approach may approach or even become a "preferred embodiment" for implementing the following innovations.

Better Timing Calibration can Assist Cyber-Physical Security

Cyber-Physical Security is a relatively new (2012) category of not just study but of research activities leading toward various deployed technology and products. In short and as the label indicates, Cyber-Physical Security centers on the very common situation where "networks" have inseparable physical versus information/communications aspects. Cyber Security is the obvious parent to this new field, where now the geographic and physical layouts of nodes in a network become an important additional component to the need for securing such a network.

Geography and physical vulnerability offer up both new threat landscapes as well as new defense strategies. This section describes how proliferating much better timing calibration into "the Smart Grid" at its various nodes can provide new tools of defense against network attacks of various flavors and motivations.

Recent literature (e.g., Mo et al, "Cyber-Physical Security of a Smart Grid Infrastructure," Proceedings of the IEEE, January 2012) quite adequately describes and promotes the growing need to understand and defend a new generation of security threats to large, complicated, life-critical networks. The electrical power grid is one of the prime example networks in this regard. Motivations from mischievousness through economic gain through outright terrorism span the range of concerns. As with railroad systems, roads, water supplies, and data transmission networks, the Smart Grid can be characterized as a network where network nodes are sporadically distributed with intensive cost constraints limiting the options for protecting and securing each and every node in the network. From physical tampering or destruction of a node on the one hand, to "hacking into a node's operations" on the other, one can easily appreciate the basic problem.

The existing literature on the general principles of Cyber-Physical threats and defenses are a better place to find more detailed descriptions of the problems and current set of proposed solutions. Applicant believes that this technology can either supplement and improve certain prior art approaches that have been studied, articulated in publications and variously deployed, AND, may offer up brand new avenues to Cyber-Physical Security. A bedrock belief is that better timing, and to only a slightly lesser extent better locating of nodes, can play a fundamental role in Smart Grid security.

Identifying Anomalous Network Behavior

One truly classic foundation of all security is to operationally define when something is fishy. This is deliberately stated as such, because every network/system is different and each will have its own set of operating characteristics that experts in those networks grow to recognize and rely upon in terms of their security definitions and subsequent system monitoring, all with an eye toward keeping things running normally and being able to spot any anomalous conditions as they might arise, i.e., when something seems fishy.

The Smart Grid and smart meters generally share one defining characteristic and that is, apart from things such as electric trains and whatnot, nodes in the system pretty much stay put during normal operations of the network. Where this condition of general physical stasis may open up a threat—since not every node can have its very own guard dog or crypto-key Faraday cage around it, it also represents an opportunity to define "normal network behavior" around this stasis. Diving quickly to one example: House X with its smart meter can quickly determine that message packets received from its designated neighborhood communication hub always seem to be "delayed" by 2.5 microseconds once timing calibration is applied to both the packet-sending hub's counter and the packet-receiving meter's counter. There is the typical "slop" on these values perhaps in the couple hundreds of nanoseconds range due to very low cost counter implementations, but, bounds of normalness and bounds of potential anomalies are clearly manifest.

Sub-microsecond event timing of many types all become fodder for characterizing normal versus anomalous network behavior.

Another example is to sample a neighborhood's dozens of smart meters for their "typical" power phase mismatches between each other, then resampling a month or two later only to find a single home or some small neighborhood of homes inexplicably "phase deviated" from their historic relationships to other homes. Was there recent line/transformer work done in the area, or is there something fishy?

The technical underpinnings of gathering the raw power phase and location data for the node have been well described in previous sections. The additional technical description involves methodologies to identify particular expected behaviors surrounding this new class of empirical data (time differences, locations), programming a network to generate and collect such data if it isn't doing so already, then overlaying procedures which on the one hand characterize "normal behavior" with respect to these new measurable quantities, and then characterize anomalous and/or "clear attack" types of behaviors. Such activities manifest as independent software routines, usually stacked and parallelized, simply watching/monitoring the network as it operates.

Another specific example of how better timing calibration provides for better security is in an implementation where the acceptance or rejection of message packets not only includes the classic encryption and/or digital signature authorization steps quite commonly used in cyber-security, but an additional level of "authentication" is provided by exactly when packets are sent and/or received. This timing authentication of packets can become a challenge in wait-state dominated physical channels such as metallic wire or fiber optics (with their attendant switching/routing circuitry), but it becomes quite viable in free-space communication channels and especially viable in situations where physical stasis is the norm, not the exception.

A particular implementation involves placing into communication packets effectively the following message: "You should be receiving this packet at XXX.YYYYYYY UTC, and if you don't something might be fishy". The "UTC" here used is of course calculated post facto, e.g., utilizing techniques previously described and tying at least one node of the network into GPS/UTC standard time. A system time can also be used, or, even, one node can tell another node "you should be receiving this packet at such and such a count of your own local counter," e.g., if a web service approach is being used where all nodes send their local counter data to the web service. The tolerances on "when the packet should be received" can of course be adjustable to any given channel, such that perhaps channels more subject to delay variations can have more liberal tolerances compared to highly consistent clean line of sight channels.

Better Timing Calibration can Assist CVR (Conservation Voltage Reduction)

CVR, or Conservation Voltage Reduction, is a relatively recent and up and coming approach to shaving a couple/few percentage points of inefficiency in energy consumption across small to large regions of power consumers. See for example Schneider et al, "Evaluation of Conservation Voltage Reduction (CVR) on a National Level," US Dept. of Energy Document PNNL-19596, July 2010.

At first glance it may not be obvious why sub-microsecond calibration of not only power phase but also power amplitude may have a beneficial role to play in carrying out and deploying CVR. This section details how such timing calibration benefits CVR. It breaks out into two categories: modeling and real-time regulation.

Modeling/Empirical Feedback Benefits

An oft-repeated challenge to CVR modeling is that the complexity and desired granularity of region-wide modeling remains tricky at best. Minute-scale time series analyses and class-scale models of power consuming devices (displays, toasters, thermal vs. solid-state lighting, etc.) are the 2012-era norm for modeling, and region-wide empirical feedback for such modeling is apparently difficult and costly to produce.

Aspects of this technology are suited to improve this situation. In particular, a tighter timing correlation between discrete voltage regulation events within a distribution network, and, power consumption responses at a multitude of smart meters downstream from those discrete events, sets up a very classic stimulus/response network steeped in empiricism. Those practiced in the art of power measurement can appreciate that empirical plots of singular regulation events, time-correlated with e.g. the next 60 power cycles (1 second) of detailed phase/amplitude power measurement at hundreds or thousands of power consuming smart meters, becomes a rich source of empirical data for modeling purposes. Sub-microsecond calibration may be a tad overkill (more than sufficient) for studying classic thermal device responses, but may become of more and more relevance as consumption devices themselves march down the digital/discrete evolutionary road.

The technical approach is rather straightforward, borrowing heavily on previously described plumbing level details which are not repeated here. All or simply some selected group of smart meters simply have a "save power waveform over N cycles" mode, if they don't have such a mode already. The waveform would thus include amplitude (of any requisite variable such as voltage, current, etc.) as well as inherent phase (e.g. ZCD). A smart meter becomes a kind of classic waveform digitizer, wherein rather than having a technician initiate a waveform capture—as is common in signal measurement experiments, a command instead is sent from a controlling node along the following lines: "capture N cycles of power waveform in precisely M cycles from receipt of this command." It becomes thus a scheduled power waveform capture. There will be inevitable "cycle-slop," if we can call it that, thus N can be in the tens or even hundreds of cycles, so that smart meter X on one side of town generally overlaps with smart meter Y on the other side of town. This level of detail borders on the pedantic for those practiced in the art, the main point is that large scale coordinated/"synchronized" measurements of power waveforms is thus enabled. Each smart meter just packages up its waveform data, almost always compressed in one way or another, and then ships such data to a designated location as such the smart meter already does for garden variety meter reading. Data packet sizes in the kilobyte or two range ought to be achievable for N cycles, where N is in the double digits.

CVR Real-time Regulation

Inherent to the previous section is extending the waveform measurement network into network-management activities. Many things that can be studied in discrete experiments can readily extend into feedback-loop control systems, once modeling or even empirically-informed behaviors have been characterized. In the case of CVR, current methodologies of voltage regulation are themselves tied into real-time network measurements. If the economics of another half percent or more of efficiency may be a possible consequence, then the one-time cost structure of routinely designating certain distributed smart meters to become "edge power digitizers"—sparse sampling devices if you will—then the overhead of setting up such a network may well pencil out.

Again the technical underpinnings here are straightforward, skipping the previously described plumbing details: Region-wide stimulus (voltage regulation)—response (hundreds of edge meter waveforms) can be set up to regularly occur either at the frequencies of the voltage regulation events themselves or some appropriately sub-sampled rate (usually dictated by communication bandwidth issues/costs, but also by number of nodes in the sampling network, diminishing returns on the usefulness of the raw data, etc.). Results of the stimulus/response measurements and analysis for a real-time control-loop system are in the very do-able sub-second range (where modeling/empirical data has "tuned" how these measurements play into a control-loop on the voltage regulation itself). Control-loop practice commonly knows how to deal with various time scale constants relative to new sources of control data.

By arrangements such as the foregoing, the present technology is leveraged to provide a range of additional benefits—far outweighing the technology's small marginal cost.

Additional Applications

Above, we detailed methods and system configurations for providing precision timing for metering and measurement in power generation and distribution systems. Embodiments of the methods described above use pre-existing communication components within meters or other measurement devices distributed in the power grid to communicate clock count data to each other. Timing relationships between the independent clocks of these devices (e.g., the relative clock rate and count offset) are derived from the clock count data in packets transmitted between the devices. These timing relationships between devices enable the timing of a measurement on one device to be correlated with the timing of a measurement on another device with improved granularity, even in cases where latency between packet transmissions is higher.

Methods that implement this approach provide timing assurance and granularity of measurements without requiring expensive, dedicated timing or GPS devices within each device. Dedicated timing or a GPS unit may be used as a reference for a group of devices, but is not required in all measurement units. In particular, as noted above, the reference provided by a dedicated timing resource may be propagated through a network of devices based on the derived timing relationships among those devices. As demonstrated above, these core methods enable a variety of applications. Additional power system applications are detailed in the following sections.

Distributed Power Generation

Distributed power generation refers to a mode of power generation in which electricity is generated by energy sources at locations distributed across the power grid. An increasingly prevalent example is solar cell or photovoltaic electricity generation. Such distributed generation requires monitoring and management that benefits from integration of the above methods for precision timing and calibration of measurements.

One opportunity is to employ these methods to manage the interconnect between a distributed power generator and the power grid for grid safety and stability. 1547 IEEE is a standard of the Institute of Electrical and Electronics Engineers that provides a set of criteria and requirements for the interconnection of distributed generation resources into the power grid. It establishes requirements relevant to the performance, operation, testing, safety, and maintenance of the interconnection. Specifically, IEEE 1547-2003[2] sets interconnection standards for distributed generation systems up to 10 MVA. It provides the over/under voltage and frequency requirements, the voltage/frequency sag and surge response criteria, the power quality, and the loss of utility detection requirements for distributed generation devices.

In seeking to comply with these standards in distributed generation, there is a need for balancing of safety and stability concerns. Under certain conditions, safety concerns dictate that distributed generators (DGs) must be disconnected from the power grid. However, implementations of circuitry for detecting the conditions for disconnecting sometimes err on the side of protection, causing disconnects, even when they are unwarranted, leading to DGs disconnecting unnecessarily. When the protection standards were initially set, this may have been a satisfactory trade off, as power from DG was an insignificant fraction of the overall power generation. As DGs become a greater fraction of the power system, unnecessary disconnection can have a significant impact on the overall system.

Islanding refers to the condition in which a DG continues to power a location even though the electrical power from the grid is no longer present. Islanding is viewed as a safety concern as it may be dangerous to utility workers who do not realize that a local circuit is still powered. It may also prevent automatic reconnection of devices. To address this problem, the above standards specify requirements for detecting islanding and stopping the DG from producing power. DGs must implement an anti-islanding method, e.g., by including an anti-islanding circuit, or control system. For solar DG, such methods are typically implemented in inverters or in a control system of the utility that monitors for islanding conditions. Sandia Report SAND2002-3591, Bower, Ward; Ropp, Michael, entitled "Evaluation of Islanding Detection Methods for Utility-Interactive Inverters in Photovoltaic Systems," describes and evaluates methods and circuits for detecting and testing islanding conditions, including passive and active methods in inverters, methods controlled by the utility outside the inverter, and methods involving communication between the inverter and the utility. This report is hereby incorporated by reference in its entirety.

Since that SAND2002-3591 report, DG has grown more prevalent, leading to the concern introduced above in which disturbances within the power system trigger anti-islanding protection, even though islanding is not present or can be effectively managed without disconnection (e.g., ride-through). For example, a disturbance in the power system may cause a fluctuation in frequency to be detected by an inverter of a DG, which triggers anti-islanding control. The anti-islanding measures are unnecessary if the DG is still operating in a compatible range relative to the local substation. This problem has been acknowledged in the power generation industry, leading to developments in improved anti-islanding control. This improved control offers the potential of enabling the DG to "ride-through" a disturbance and continue operation, supplying power to the local consumer or supplying it back to the grid.

As introduced above, PMUs can be used to detect dangerous conditions and enable protective measures to be taken. More recently, consistent with this functionality, PMUs have been suggested as a means to enable system operators to monitor phasor data and manage restoration after a system has been become islanded. See, Smart Grid Roadmap, IP-1 ISO Uses Synchrophasor Data for Grid Operations, Control, Analysis and Modeling, Version 3.1, Oct. 29, 2010. As suggested in this report, synchrophasor measurements at the interconnecting substation or at the closest substation enable operators to assess how much generation must be changed to move the frequency and phase angle between two systems closer together if required to parallel the islands.

In another DG system, power line communication is suggested as a means for implementing a permissive signal anti-islanding function. See, SANDIA Report SAND2012-1395, Solar Energy Grid Integration Systems, Final Report of the Florida Solar Energy Center Team, by Ward Bower, Sigifredo Gonzalez, Abbas Akhil, Scott Kuszmaul, Lisa Sena-Henderson, Carolyn David, Robert Reedy, Kristopher Davis, David Click, Houtan Moaveni, Leo Casey, Mark Prestero, Jim Perkinson, Stanley Katz, Michael Ropp, and Alan Schaffer. As noted in this report, utilities continue to have concerns about localized anti-islanding solutions in a high-penetration scenario when many inverters on a feeder are running identical anti-islanding algorithms. See, R. Reedy, K. Davis, D. Click, M. Ropp, and A. Shaffer, —Power Line Carrier Permissive as a Simple and Safe Method of Enabling Inverter Ride-Through Operation of Distributed Grid-Tied Photovoltaic Systems, 2011 IEEE International Symposium on Power Line Communications and Its Applications (ISPSAI), Udine, Italy, May 2011.

While synchrophasors have been proposed as a potential solution, they do not address the common downed-wire hazard, when a single distribution conductor falls from a power line to an accessible location. The authors of SAND2012-1395 suggest that permissive signal anti-islanding offers the potential of reliable anti-islanding protection with the benefit of allowing utility enabled ride-through.

While these approaches show promise, they are unlikely to be viable from a cost perspective for wider deployment. Our methods offer an effective alternative for monitoring conditions within a lower cost smart meter that can be deployed ubiquitously in inverters and other DG management devices.

Our methods enable the smart meter at the DG interconnect to maintain sufficiently granular time synchronization of the local clock (e.g., derived from an oscillator in the smart meter) with a time reference maintained by the utility. With this timing relationship established, the smart meter correlates its internal power line measurements, such as the phase as detailed above, with those of other energy sources, namely the utility, according to the relationship between the local oscillator and remote timing source (e.g., one provided by a PMU within the utility or some other time reference maintained by the utility). When the smart meter detects that that local phase measurement has deviated more than a threshold from the power source relative to which islanding is being monitored, it triggers islanding protection. That power source is typically going to be the feeder from the utility, and its phase may be communicated from a local station, e.g., the local substation. The islanding protection triggered in response may employ existing methods for disconnect and re-connect management. Since the meter is correlated to the utility's measurement of grid state, it enables the DG to ride-through cases where a disturbance might otherwise cause local anti-islanding control to take protective measures.

In the above scenario, the smart meter receives both phase measurements and timing information from the power source for which the DG interconnect is being managed. The meter may receive these in the same or different communication channels, each with different latency. The phase measurements are received more frequently to comply with islanding response requirements in the range of seconds.

The specific implementation of our methods is preferably adapted to utilize the communication devices and standards in place, to enable low cost adaptation of the methods to existing equipment. Smart meters communicate with a utility's data collector, which in turn, gathers data from smart meters in an area and provides it to the utility, typically via a fractional T-1 line. Smart meter manufacturers have implemented proprietary versions of AMI, which may include power line and/or RF remote communication capability. Some deployed smart meter models transmit/receive in the unlicensed frequency band of 902 to 928 MHz between the meter and a utilities data collector or other data relay system. They may also include additional radio components for communicating within a consumer's wireless network.

One challenge with existing smart meter communication is that it typically operates at high latency relative to synchrophasor performance today. For example, one packet of information, in full duplex communication, is transmitted and received every 15 minutes in an existing AMI implementation for electric power smart meters. Alerts may be generated as well, in an asynchronous communication mode between meter and utility data collector. For phase information, the meter receives phase data from the utility's transmitter more frequently. This phase measurement is provided along with the power source's time reference for that measurement. This communication of phase data can be implemented using AMI or a separate low cost receiver in the smart meter dedicated for receiving such data from the utility.

For timing, our methods accommodate the high latency of typical smart meter packet communication by gathering clock count data in packet exchanges and calibrating for the local clock error. We examine the Parts Per Million (PPM) clock error characteristics of current oscillators in the particular target smart meters and determine the amount of observations we need to capture to calibrate the local clock to a time reference. For a typical oscillator characteristics today, this shows that a modest addition of, e.g., 3 quick redundant packet exchanges every 15 minutes (instead of just one packet), enough count stamp data from the source and local clock can be gathered and stitched together with the previous and next 15 minute exchange, such that the interim 15 minute period can still be 'post calibrated' to roughly 10 microseconds or better, possibly even 1 microsecond for well-behaved oscillators where the slopes and second derivatives of oscillation change has been measured every 15 minutes. These three packets provide a quick measurement of the instantaneous 'slope' of time deviation, and then the slope of the slope due to temperature dictates how the next 15 minutes of operation will drift.

Despite this drift, powerline measurements are locally sampled and stored at higher granularity. As described above, one powerline measurement is the phase which can be determined using above zero crossing detection. The meter's reading of data exchanged from at the next 15 minute communication then provides the timing reference that anchors measurements during the intervening 15 minutes. The empirically determined precision of the calibrated time reference falls in the 1 to 10 microsecond range for current oscillator types.

Our method accommodates relatively high latency packet communication in typical smart meters. Even in a cycle time on the order of minutes, 'clock wander' measurements are made from clock count data compared between source and local clocks. The measurements are not just comparing instantaneous clock discrepancies but, more importantly, clock rate measurements which then can a) extrapolate to the next packet exchange within an empirically-defined accuracy based on the particular oscillator and ambient conditions of a meter; and b) interpolate to the last packet exchange once a new packet is received and likewise compared to the measurements at from earlier exchanges (and thus slightly correct the previous extrapolation, given that the new measurement will be slightly off from the extrapolated prediction).

The calibration of the smart meter clock enables the smart meter to correlate its local powerline measurements in local clock time to the measurements of the utility in a reference time maintained by the utility. For anti-islanding control, the smart meter monitors local powerline phase relative to the phase of the power from the utility, which is provided at a rate sufficient to comply with anti-islanding requirements for responding to detection of deviations in power waveform standards. The smart meter compares the utility-provided phase with its locally sampled powerline measurements, which are more granular in time than the packet exchange for clock calibration.

The above methods can provide more effective management of the interconnect of DGs with the power grid because they provide an effective, low cost way of monitoring power conditions at an interconnect of a DG and within a DG. The management of anti-islanding conditions is just one application that the technology enables.

Web and Cloud Based Services

The calibration of clocks and correlation of measurements may be provided in a network or "cloud-based" service. In this mode, the utilities data collector and/or the meter send packets and measurements made between packet communication intervals to a web service. The data collector that communicates with several smart meters may act as a router that sends its packets to the web service, and also aggregates and sends packets from the smart meters in its area. This configuration enables the packet traffic from smart meters to use the AMI communication channel and associated security, and the data collector's connection to a cloud service that adheres to SCADA security protocols. Alternatively, one or more smart meters or PMUs may act as routers, directing packets from other smart meters and data collectors to the cloud service. Many configurations are possible. The web service calibrates the smart meter clock time to a time reference (such as the utility time reference), and correlates measurements that apply to particular smart meters to that time reference. Based on analysis of the measurements, the web service formulates alert conditions, instructions and other system data sends packets back to the smart meters and utility computers.

This cloud service model affords a number of advantages. First, the DG operators, consumers and utility take advantage of computing services in the cloud, which enables the cost of the computing to be spread across the servers in the cloud. The cloud service can manage ad hoc networks of measurement units and smart meters that pertain to a utility or a particular area (such as a substation or feeder line). Thus measurements such as the phase of power from the utility that are common to a network of devices can be monitored and communicated in a uniform fashion to those devices that are impacted. The actions of DGs in an area can be coordinated in terms of their connection to the grid for anti-islanding control, as well as coordinated supply of power back to the grid. This enables the cost overhead and security of the added telemetry provided by the smart meters to be maintained at or near existing levels.

Fault Tolerant Time

The above approaches enable fault tolerant time to be propagated to the smart meters in the network as well as computers and measurement devices of the utility used for measurement, data collection, monitoring and control of power distribution. From the perspective of DGs, the fault tolerant time provides a time reference against which the supply of power to and from the grid is measured. This provides a means of auditing the power supply to and from the grid. It also provides a method of avoiding bigger time errors that can sometimes occur in the data collector or smart meter, causing errors in billing for power services. This is particularly important as rates for power vary depending on the time of day. If the timing is wrong, the wrong rates are applied. Fault tolerant timing services provided by a network service provides another means to audit the power metering system and validate that meters are accurate. This provides added value to the utilities, as they have another tool to establish that they have adequate financial controls in place (i.e. for Sarbanes Oxley compliance). We elaborate on this audit role more below.

Power Consumption Billing and Power Supply Payment Auditing

The reliability of power consumption billing methodologies has been the economic backbone of electric power supply for over a century. The more recent paying $3^{rd}$ party power suppliers, such as solar power suppliers, for the power they add to the grid has set up the now familiar give and take situation where such entities sometimes are net suppliers of power and thus need to track due payments for that supply, and at other times are net consumers of power and need to have billings tracked accordingly. The above methods and system configurations offer new tools and auditable procedures to this back and forth billing/payment dance.

The word 'audit' has broad meanings concerning the evaluation and oversight of various systems and organizations, with the sub-category of accounting and monetary transactions implicitly if not explicitly contained in the definition. For this disclosure, we use this term here as it can apply to the previous paragraph's description of the real time ebb and flow of power consumption and power supply. With the proliferation of rooftop solar panels in particular, it can be expected that more and more facilities with smart meters tracking these ebbs and flows will be needed. With this growth is the need to expand measurement and auditing procedures for these increasingly democratized devices and variable rate structures, which depend on when and in which direction power is being supplied. It is not a stretch to liken smart meters to cash registers in the home if more folks become incented to become net power suppliers.

One central concept in accounting-auditing is the notion of at least two-party measurement, sharing of the measurements, and then explicit post-agreement by the two parties that the measurements match and can be mutually recorded in some financial transaction system and/or database. As distributed generation of power and its independent supply to the grid grows, a cost-based division naturally appears between the simplicity of the meter at the power generating point making second by second measurements of power supply versus power consumption (it is cheap in that these measurements can be made and stored in local memory), and the more complex process of having some regional or neighborhood metering device owned by a local utility attempting to make similar kinds of measurements aimed at verifying these local measurements. Better timing at the local meter, combined with power measurement methods and software processes implemented with implicit or explicit approval of the utility, can help set up a more granular reporting (for example every 15 minutes), of what the local device has measured with regard to the previous period's ebb and flow of either being billed for power consumption or paid for power supply. The utility then has the option to check such reporting against aggregate measurements it may be making at sites where it has its own fine granularity measurements. Upon performing such procedures across a range of such suppliers/consumers, a higher level of aggregate accounting/auditing is enabled where even modest scale cheating (premeditated or accidental alike) can be flagged. Barring such discrepancies in measurements between distributed meters and aggregation meters, explicit auditing approvals and storage of economic transaction data can be mutually approved and set into the records for monthly billings/payments and the like.

One customer benefit that such a system could provide, offered from the utility to that customer, is to provide an hour by hour web service portal access to that customer on the realtime ebb and flow data. Trends in the industry are already headed in this direction at least for a small sliver of customers who seem to care about monitoring power consumption, but with the methods described above, those same customers who also have power supply capabilities can literally watch as there net power usage turns from making payments to the utility to seeing checks come to them from that utility.

Security Improvements

The security of wireless networks of smart meters has become a leading topic in the industry. A very general principle for any approach to security surrounding any type of network involves the simple notion of discriminating between normal operations and anomalous operations. Assuring more reliable and accurate time to the edges of a network can become an important tool in this general area of normal versus anomalous or even illegal operations.

Specifically, when a given smart meter is initially installed, powered on and set up to join the network, a simple series of communications protocols can be followed whereby the detailed timing of these protocols is measured during the performance of these communications operations. Duplex back and forth timing of sent packets and received packets can be recorded. This initial set-up is providing the seeds of what might be called a 'timing signature' of normal network communication operations. Furthermore, the next few days of presumably 'normal' communications traffic between a newly deployed smart meter and its assigned network hub can also be measured and recorded (local timing of sent and received packets; hub-timing for the same receipt and sending of packets). This few day set of timing data from both devices can be stored in a master database under the heading of 'security' and 'normal timing signatures'. Those practiced in the art of intermittent communications will recognize that even in this so-called 'normal' state, a good deal of variability will be seen but there will nevertheless be an empirically derived envelope of steady behavior that will eventually settle in. Weeks and months of ensuing 'normal' communications can be checked against this security signature and even be used to continually update the signature if it is deemed in line with the signature's established characteristics. On the other hand, significant timing deviations from this normal timing signature can also be flagged for human follow-up and inquiry. As with all security applications where subtle incursions and hacking involve the human cat and mouse game between hackers and security engineers, there should be an expected level of imperfection and tuning of what constitutes a normal signature and the degree of (and cost of) human intervention when anomalous or suspected-hacking activities are detected.

Machine learning and classifier technology may be used to discriminate between a signature considered normal, and one that is abnormal, or as well as sub-classes of abnormality due to malicious or non-malicious perturbations of the system. In such an approach, a classifier is trained on a training set of timing of communication input labeled as "normal." Sets of abnormal input may be labeled and used to train a classifier to discriminate particular classes of abnormal signatures. Additional measurements from the packets, such as power line measurements, may also be added to input vectors used to train the classifier, and then used to classify communications among meters, including data collection units, PMUs, and other nodes in the network of devices in the power system.

Various machine learning technologies are applicable for designing, training and maintaining a classifier. For example, embodiments of this classifier technology can employ vector quantizer based classifiers and/or Support Vector Machine classifiers, as described in our co-pending application Ser. No. 14/201,852, filed Mar. 8, 2014, which is hereby incorporated by reference.

Embodiments may also employ neuromorphic processing techniques (sometimes termed "machine learning," "deep learning," or "neural network technology") for dealing with multi-dimensional data. As is familiar to artisans, such techniques employ large arrays of artificial neurons—interconnected to mimic biological synapses. These methods employ programming that is different than the traditional, von Neumann, model. In particular, connections between the circuit elements are weighted according to correlations in data that the processor has previously learned (or been taught).

Each artificial neuron, whether physically implemented or simulated in a computer program, receives a plurality of inputs and produces a single output which is calculated using a nonlinear activation function (such as the hyperbolic tangent) of a weighted sum of the neuron's inputs. The neurons within an artificial neural network (ANN), are interconnected in a topology chosen by the designer for the specific application. In one common topology, known as a feedforward network, the ANN consists of an ordered sequence of layers, each containing a plurality of neurons. The neurons in the first, or input, layer have their inputs connected to the problem data, which can consist of audio, image, or other sensor data, or processed versions of such data. Outputs of the first layer are connected to the inputs of the second layer, with each first layer neuron's output normally connected to a plurality of neurons in the second layer. This pattern repeats, with the outputs of one layer connected to the inputs of the next layer. The final, or output, layer produces the ANN output. A common application of ANNs is classification of the input signal into one of N classes. In this case the output layer may consist of N neurons in one-to-one correspondence with the classes to be identified. Feedforward ANNs are commonly used, but feedback arrangements are also possible, where the output of one layer is connected to the same or to previous layers.

Associated with each connection within the ANN is a weight, which is used by the input neuron in calculating the weighted sum of its inputs. The learning (or training) process is embodied in these weights, which are not chosen directly by the ANN designer, In general, this learning process involves determining the set of connection weights in the network that optimizes the output of the ANN is some respect. Two main types of learning, supervised and unsupervised, involve using a training algorithm to repeatedly present input data from a training set to the ANN and adjust the connection weights accordingly. In supervised learning, the training set includes the desired ANN outputs corresponding to each input data instance, while training sets for unsupervised learning contain only input data. In a third type of learning, called reinforcement learning, the ANN adapts on-line as it is used in an application. Combinations of learning types can be used; in feedforward ANNs, a popular approach is to first use unsupervised learning for the input and interior layers and then use supervised learning to train the weights in the output layer.

When a pattern of multi-dimensional data is applied to the input of a trained ANN, each neuron of the input layer processes a different weighted sum of the input data. Correspondingly, certain neurons within the input layer may spike (with a high output level), while others may remain relatively idle. This processed version of the input signal propagates similarly through the rest of the network, with the activity level of internal neurons of the network dependent on the weighted activity levels of predecessor neurons. Finally, the output neurons present activity levels indicative of the task the ANN was trained for, e.g. pattern recognition. Artisans will be familiar with the tradeoffs associated with different ANN topologies, types of learning, and specific learning algorithms, and can apply these tradeoffs to the present technology. Additional information on such techniques is detailed in the Wikipedia articles on "Machine Learning," "Deep Learning," and "Neural Network Technology," as well as in Le et al, Building High-Level Features Using Large Scale Unsupervised Learning, arXiv preprint arXiv:1112.6209 (2011), and Coates et al, Deep Learning with COTS HPC Systems, Proceedings of the 30th International Conference on Machine Learning (ICML-13), 2013. These journal papers, and then-current versions of the "Machine Learning" and "Neural Network Technology" articles, are attached as appendices to co-pending patent application 61/861,931, filed Aug. 2, 2013, and this application and its appendices are hereby incorporated by reference.

As noted, the above methods enable adaptation to existing communication topologies used in the power system, and thus, can leverage attendant security protocols. Data traffic between meter and utility data collector leverages AMI security, while data traffic from the data collector to a cloud service leverages SCADA security. The owner of a smart meter can access power flow monitoring and related functions noted above using separate communication channels of the smart meter, such as its wi fi radio for interfacing with a LAN using secure network protocols. This provides a separate path for implementing cloud services does not impact the communications between the smart meter and the power company's systems for other functions. In the future, as the cost drops for 3G, 4G, LTE, and subsequent generations of wireless communication protocols, these forms of communication, and associated security, can be used to implement the above methods.

The more precise timing synchronization between smart meters and SCADA computers enables smart meters to support more sophisticated data security. For example, time synchronization between the data collector and smart meter enables the two devices to exchange and update keys used for encrypted data packets and digital signature verification according to the calibrated timing between the devices.

Additional security can be provided by limiting the opportunity for hackers to use packet communication as a way to intrude into the system. The packet exchange with utility equipment can be made on a call back basis, limiting the possibility for unauthorized devices to access the power system. Certain aspects of the inter-device communication can be made limited by direction and type of data flow to make the communication channel un-usable for hacking. Timing calibration and powerline measurements can be segregated and communicated in listen or talk only modes between devices. For instance, as noted above, meters can listen only for utility powerline measurements for internal correlation with its measurements. Timing data can be communicated in separate packets, using a communication pattern that can be monitored for intrusion as noted above, and/or using callbacks so that unsolicited intruders are disregarded.

The above techniques enhance security through:
better monitoring of the network;
effective leveraging of existing security protocols;
limitations on access to sensitive systems; and
enhanced encryption and digital signature protocols for implementing private network communication.

These techniques may be used in various combinations to provide the desired level of security for the type of service that our methods are tailored to supply.

Distributed Management Systems

As introduced above, the above techniques enable wider deployment of telemetry into the power system, enabling distributed management more cost effectively. In effect, smart meters provide wider deployment of PMU functionality without the cost. This enables CVR, where the telemetry afforded by the smart meters enables the system to have finer granularity of measurement, and as such can enable voltage regulation (e.g., power sub-systems can operate at lower voltage). Additionally, faults can be detected and isolated, and auto-switching used to feed power from an alternative sub-station.

Improved Timing for Enhanced Smart Meter Communication

The communication channel between smart meter and utility can be enhanced by using the better timing synchronization to improve communication. In particular, some smart meters rely on TDMA for communication with the data collector. The above methods for providing timing calibration can be used to improve the timing reference used to enable TDMA communications with the smart meter.

Exemplary Inventive Features

This section outlines various exemplary features in the form of methods, systems, and devices, including meter devices. Various other configurations are possible.

A1. A method useful in determining an electric power phase relationship between two devices, one device comprising a power meter device connected to a power distribution system and the other device comprising another device connected to the power distribution system, the method characterized by processing one or more messages received from the second device, together with zero crossing data generated by the first device, to determine relative timing between zero crossings of power signals sensed at said devices.

A2. The method of A1 that further includes, from said relative timing, determining whether the power signal at the first device is (a) in phase with the power signal at the second device; (b) leads the power signal at the second device by 120 degrees; or (c) lags the power signal at the second device by 120 degrees.

A3. The method of A1 in which both of said devices comprise power meter devices.

A4. The method of A1 that includes count-stamping the message(s) received from the second device, by reference to clock counts from a free-running clock in the first device that runs at 100 KHz or more.

A5. The method of A1 that includes determining relative timing between the zero crossing measurements to an accuracy of better than 25 microseconds.

A6. The method of A1 wherein at least one of said devices is devoid of a GPS receiver.

A7. The method of A1 wherein the message received from the second device is clock-stamped.

A8. The method of A7 in which the message received from the second device is clock-stamped by the second device.

A9. The method of A7 in which the message received from the second device is clock-stamped by the second device to indicate a zero-crossing event at the second device.

A10. The method of A7 in which the message received from the second device is clock-stamped by the first device.

A11. A method of determining phase relationship among power meters, the method comprising:
collecting count stamped messages transmitted between nodes in a network including at least two power meters, the messages including zero crossing measurements of a power signal sensed at corresponding power meter;
from the count stamped messages, determining relative timing among clocks within the power meters;
from the relative timing and zero crossing measurements, determining relative phases between the power meters.

A12. The method of A11 wherein the power meters include a first clock for zero crossing measurements and a second clock for count-stamping a message communicated with another node in the network, and further including determining relative timing between first and second clocks.

A13. The method of A11 wherein the zero crossing measurements within a power meter and the count-stamping of a message by the power meter are made relative to common clock within the power meter.

A14. A power meter comprising:
a metrology unit for measuring zero crossing of a power signal;
a communication unit, in communication with the metrology unit for collecting zero crossing measurements and communicating count stamped messages including the collected zero crossing measurements to a remote node for determining relative phase between the power meter and another power meter.

A15. The power meter of A14 wherein the communication unit is in communication with a local clock for count-stamping messages upon transmission.

A16. The power meter of A14 wherein the communication unit is in communication with a local clock for count-stamping messages upon receipt.

A17. The power meter of A14 wherein the communication unit is communication with a second power meter for receiving count-stamped messages and for determining phase relative to the second power meter.

A18. The power meter of A14 including a first clock for providing time for the zero crossing and a second clock for count-stamping the messages.

A19. The power meter of A14 including a first clock for providing time for the zero crossing and time for count-stamping messages.

A20. A system comprising:
a network of communicating nodes, including at least two power meters;
a node for collecting count stamped messages transmitted between nodes in a network including at least two power meters, the messages including zero crossing measurements of a power signal sensed at corresponding power meter;
a node for determining relative timing among clocks within the power meters from the count stamped messages; and
a node for determining relative phases between the power meters from the relative timing and zero crossing measurements.

A21. The system of A20 wherein the node for collecting, the node for determining relative timing, and the node for determining relative phases is a common node.

A22. The system of A21 wherein the common node comprises a server in communication with the power meters via a computer network and providing relative phase to the power meters.

A23. The system of A22 wherein the common node is in communication with a unit for providing a known reference phase from which phase is determined at the power meters based on the known reference phase and the relative phase.

A24. A system including a first smart meter in digital packet communication with a second, separate smart meter, said meters including a metrology unit adapted to produce a counter or clock datum as a function of electric power phase, said meters including a communications unit adapted to produce a counter or clock datum as a function of sending and receiving communications packets, the system being configured whereby the first smart meter determines its electric power phase relative to the second smart meter by using a sent message as a common reference for two separate counters on the two separate meters.

A25. A metrology unit for coupling to a power distribution network, comprising:

a zero-crossing detector;

a free-running counter; and circuitry that outputs a value from the free-running clock when the detector senses a zero-crossing.

Concluding Remarks

Having described and illustrated the principles of the technology by reference to a variety of embodiments, it will be apparent that the technology is not so limited.

For example, while wireless communications are used between nodes in the detailed embodiments, other embodiments can use power line communications techniques.

Similarly, while described in the context of electric power meters, it will be recognized that aspects of this technology also find application in other smart grid applications, including gas and water utility metering, and HVAC control.

Reference was made to count-stamping using a clock running at about 1 MHz. In other embodiments, lower clock rates can be used, down to even 1 KHz or less in some embodiments. Greater accuracy, however, comes with higher clock rates, so rates in excess of 10, 100, or 1000 KHz are naturally preferred. These clocks are typically free-running, i.e., they are not phase- or frequency-locked to another timing reference, such as a GPS receiver. (Systems according to the present technology can incorporate GPS receivers for timing purposes. However, GPS receivers introduce additional costs and failure modes. Moreover, GPS signals are not available in some locations, e.g., indoors, where meters may be placed.)

As discussed above, while relative timing on the order of milliseconds is adequate for distinguishing A, B and C phases, for use in phasor measurement unit applications, much more accurate timing is required. Timing accuracy to less than one degree of phase is commonly required, i.e., below 46 microseconds. More typically, measurements with still more timing accuracy are desired, e.g., below 10, 3, 1, 0.3 or even 0.1 microseconds (which corresponds to clock counters operating at 100 KHz-10 MHz).

As will be recognized by an artisan, one particular arrangement employs a free running oscillator that drives a counter circuit. The output of the counter circuit is captured, or "latched," on the occurrence of a triggering event (e.g., a zero crossing, transmission of a packet, receipt of a packet, etc.). Another particular arrangement employs "time of day" data that is commonly available in smart meters.

It will similarly be recognized that embodiments in which a signal is clock-stamped on its receipt can be modified to instead produce embodiments in which a signal is clock-stamped on its transmission.

Not all communications need be full duplex, as some embodiments may include receive only and transmit only nodes, with variations on count stamping on transmission or receipt of packets. Such variations are pertinent to embodiments where certain nodes are un-cooperating, as well as alternative peer to peer, client-server, peer-router-server, etc. configurations. Un-cooperating nodes transmit packets as part of their normal mode of communicating with other network devices, yet, for various reasons, do not cooperate by count stamping. Such nodes can still contribute as they can share pertinent message data, such as zero-crossing measurements and can be count stamped upon receipt by cooperating nodes. In peer to peer modes, smart meters each can participate on relatively similar basis in terms of sharing zero crossing measurements and count-stamping function, with each smart meter capable of serving as at least a temporary master or server of phase indication or calibration to other nodes. In client server nodes, the server may act as a centralized receiver for zero crossing measurements. In client-router-server modes, a router is added to a client server mode to facilitate the routing of packets to a server, and where appropriate, provide count stamping and circulating of packets among other nodes.

As will be understood, time-stamping of an event associates a time-related datum with the event. This is typically a conventional time standard, such as GPS, UTC or Unix time, coordinated with a reference of some sort—commonly measured in seconds and related increments. Count-stamping is a different term, and associates an event with a datum that commonly has no meaning outside the context of the particular counter/crystal oscillator/etc. from which it was derived. (Some free-running time-of-day clocks may be regarded as sources of mere count stamp data, since such a clock's understanding of time is not tied to any other reference.) Embodiments described as using count-stamps can use true time-stamps—simply as another form of count. The term "clock-stamping" encompasses both.

It should be understood that some embodiments may simply share zero crossing measurements, with a count stamp on receipt only. Some embodiments may further just share zero crossing data, with the assumption that the time delay for putting the measurement in a packet and sending it and receiving it gets worked out in the sharing of packets over time. If the zero crossing measurement on one device is sufficiently accurate, and there is a fairly predictable delay in sending the zero crossing to a receiver, then count stamping on receipt can suffice. In some such arrangements, the zero crossing measurement on one device is one clock latch, and then the receipt of the measurement is another clock latch that is sufficient to inter-relate the time of one meter with the time of another meter.

If the latency of measurement—to the sharing of the measurement, is known, or at least consistent or predictable or random Gaussian, the system need not count stamp the message, or in the reverse, the system can count stamp the message but not the zero crossing. If desired, such error is addressed through averaging or filtering or linear regression or modeling, or least squares estimation etc. of timing relationships based on tracking shared data over time. Kalman decomposition techniques can similarly be applied.

As is familiar, communication between meters and other system components can be, e.g., by radio or over power lines. Radio communication can be by WiFi, Zigbee, WiMax, 4G, etc. Such communication can be either direct (end point to end point), or in a packet-switched arrangement, relayed through one or more intermediate nodes (which can comprise smart meters).

Additional arrangements for electric meter phase identification are detailed in published patent applications 20120169322, 20120169322, 20110285382, 20110161022, 20110130992, 20100164473, all assigned to General Electric Company. Additional systems, e.g., including phasor measurement units, are detailed in published patent applications 20090076745 (Toshiba), 20090088990, 20090089608, 20090088989, and 20120063039 (Schweitzer Engineering Laboratories), 20100072978 (Mitsubishi) and 20100179779 (Accenture).

Although much of this disclosure focused on metrology, it should be recognized that the PhaseNet technology (e.g., as detailed in patent documents U.S. Pat. No. 7,876,266 and 20090213828) enables count-stamped transmissions ("pings") exchanged between nodes in an ad hoc network (e.g., of smart meters) to be used to derive highly accurate location data (e.g., more accurate than GPS) by solving a system of linear equations. No longer must service personnel budget time for wandering to find a meter. They can bring a smartphone on service calls to query a web service. The web service receives count-stamp data from a variety of nodes—including the intended meter, allowing the web service to determine the location of the meter and report this information back to the service staff's smartphone. (The same web service—or another—can similarly determine the position of the smartphone, enabling a smartphone app to give precise directions to the meter.)

Such a web service can periodically poll all meters and other distribution apparatus in a utility's service area, and update a central GIS (geographic information system) database with precise latitude/longitude coordinates for each device. This archival information is useful, e.g., in dispatching repair crews during power outages.

In addition to deriving location information, this same collection of count-stamped "ping" data from an ad hoc collection of network nodes can similarly be processed to derive a highly accurate network time—despite being based on individual clocks operating at different rates and with unknown timing errors. Any device in the network (e.g., a meter), having access to such a collection of count-stamped data, can derive this network time standard (which, again, is more precise than the data commercially available from GPS).

PhaseNet thus offers the capability to synchronize meters without the added cost of adding dedicated GPS chips or other special purpose hardware dedicated to clock synchronization or positioning. Delays, such as time of flight of the wireless signal between nodes, can be readily measured with such techniques, and compensated—for in those applications that require it.

The past decades' development of synchrophasor and other phasor measurement technologies posits microsecond and sub-microsecond levels of timing calibration. Hence, PhaseNet technology is ideally suited for this application in the next decades.

The web services noted in this disclosure can be located in the cloud, a data center, a network router, locally (e.g., within a smart meter), etc. In addition to the other noted functions, the web service can calculate inter-counter relationships (i.e. ZuluTime, including clock rate relationships and clock offsets, etc.).

In the interest of conciseness, the myriad variations and combinations of the described technology are not cataloged in this document. Applicants recognize and intend that the concepts of this specification can be combined, substituted and interchanged—both among and between themselves, as well as with those known from the cited references. Moreover, it will be recognized that the detailed technology can be included with other technologies—current and upcoming—to advantageous effect.

The design of devices referenced in this disclosure is familiar to the artisan. In general terms, each includes one or more processors (e.g., of an Intel, AMD or ARM variety), one or more memories (e.g. RAM), storage (e.g., a disk or flash memory), a user interface (which may include, e.g., a TFT LCD and, for the web server, a keyboard, etc.), interconnections between these elements (e.g., buses), and an interface for communicating with other devices (which may be wireless, such as GSM, CDMA, 4G, W-CDMA, CDMA2000, TDMA, EV-DO, HSDPA, WiFi, WiMax, mesh networks, Zigbee and other 802.15 arrangements, or Bluetooth, and/or wired, such as through an Ethernet local area network, a T-1 internet connection, etc.).

More generally, the processes and system components detailed in this specification can be implemented as instructions for computing devices, including general purpose processor instructions for a variety of programmable processors, including microprocessors, microcontrollers, digital signal processors, etc. These instructions can be implemented as software, firmware, etc. These instructions can also be implemented to various forms of processor circuitry, including programmable logic devices, FPGAs, and application specific circuits—including digital, analog and mixed analog/digital circuitry. Execution of the instructions can be distributed among processors and/or made parallel across processors within a device or across a network of devices (including "the cloud").

Software instructions for implementing the detailed functionality can be readily authored by artisans, from the descriptions provided herein, e.g., written in C, C++, Visual Basic, Java, Python, Tcl, Perl, Scheme, Ruby, etc. Devices according to the present technology can include software modules for performing the different functions and acts.

Certain of the detailed devices may include operating system software that provides interfaces to hardware resources and general purpose functions, and also includes application software which can be selectively invoked to perform particular routines. Existing smart meter software and web services software can be adapted for many of the uses detailed herein. In some embodiments, APIs are provided to fetch values (e.g., count-stamps associated with packet and zero crossing events).

Software and hardware configuration data/instructions are commonly stored as instructions in one or more data structures conveyed by tangible media, such as magnetic or optical discs, memory cards, ROM, etc., which may be accessed across a network. Certain devices may be implemented as embedded systems—a special purpose computer system in which the operating system software and the application software is indistinguishable to the user. The functionality detailed in this specification can be implemented in operating system software, application software and/or as embedded system software.

Although this specification has described the technology largely in terms of methods, it will be recognized that our technology also encompasses apparatus that performs such methods, and tangible computer media that contains software instructions to configure a system (e.g., a processor or microcontroller) to perform such methods.

To provide a comprehensive disclosure, while complying with the statutory requirement of conciseness, applicant incorporates-by-reference each of the documents referenced herein. (Such materials are incorporated in their entireties, even if cited above in connection with specific aspects of their teachings.)

The documents referenced herein disclose technologies and teachings that can be incorporated into the presently-detailed arrangements, and into which the technologies and teachings detailed herein can be incorporated. The reader is presumed to be familiar with such prior work.

The invention claimed is:

1. A method comprising:
    at an interconnect of a distributed generator to a power grid, count-stamping an event with a free-running clock that runs at 100 KHz or more, to thereby provide a time reference, said count-stamped event being a zero-crossing of an AC power signal produced by said generator, a transmission of a data packet, or a receipt of a data packet;
    establishing a timing relationship between the time reference at the interconnect and a time reference associated with the power grid;
    based on the timing relationship, correlating a first power line measurement at the interconnect with a corresponding second power line measurement of the power grid;
    detecting a deviation of the first and second power line measurements, and
    in response to detecting a deviation that exceeds a threshold, triggering interconnect management at the interconnect.

2. The method of claim 1 wherein the time reference at the interconnect is provided by a local clock in a smart meter.

3. The method of claim 2 wherein the smart meter is in communication with a data collector of the power grid to establish the timing relationship.

4. The method of claim 3 further including:
    wherein the communication from the smart meter comprises packet communication;
    and the method comprising:
    gathering clock count data over a period of time, and communicating the gathered clock count data in a packet; and
    calibrating the timing relationship using the gathered clock count data from the packet.

5. The method of claim 4 wherein time between packet communication is on the order of minutes, whereas the timing relationship is calibrated on the order of 10 microseconds or better.

6. The method of claim 1 in which the count-stamped event is a zero-crossing of an AC power signal produced by said generator.

7. The method of claim 1 in which the count-stamped event is a transmission of a data packet.

8. The method of claim 1 in which the count-stamped event is a receipt of a data packet.

9. The method of claim 1 in which the distributed generator is a photovoltaic electricity generator.

10. The method of claim 1 in which triggering interconnect management at the interconnect of the distributed generator to the power grid comprises triggering an anti-islanding protection method.

11. A system comprising:
    a free-running local clock that runs at 100KHz or more;
    a processor configured to gather clock counts from the local clock, and clock counts from a remote timing reference of a power system, and derive a calibrated timing relationship between the local clock and the remote timing reference, the clock counts gathered from the local clock indicating time stamps associated with events, namely: zero-crossings of an AC power signal, or receipt or transmission of data packets.

12. The system of claim 11 in which the clock counts gathered from the local clock comprise clock stamps associated with zero-crossings of an AC power signal.

13. The system of claim 11 in which the clock counts gathered from the local clock comprise clock stamps associated with receipt or transmission of data packets.

14. The system of claim 11 in which the local clock comprises a clock in a smart meter that clock-stamps received messages.

15. The system of claim 11 in which the local clock comprises a clock in a smart meter that clock-stamps transmitted messages.

16. The system of claim 11 in which said remote timing reference of a power system comprises count-stamping performed by a node in a power distribution system.

17. The system of claim 16 in which said node comprises a smart meter.

18. The system of claim 11 in which said calibrated timing relationship comprises a determined timing between zero-crossings of AC power signals at two smart meters.

* * * * *